United States Patent
Lee et al.

(10) Patent No.: US 11,211,427 B2
(45) Date of Patent: Dec. 28, 2021

(54) SWITCHING ELEMENT, VARIABLE RESISTANCE MEMORY DEVICE, AND METHOD OF MANUFACTURING THE SWITCHING ELEMENT

(71) Applicant: SAMSUNG ELECTRONICS CO., LTD., Suwon-si (KR)

(72) Inventors: Jinwoo Lee, Seoul (KR); Zhe Wu, Seoul (KR); Kyubong Jung, Suwon-si (KR); Seung-geun Yu, Hwaseong-si (KR); Ja Bin Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 288 days.

(21) Appl. No.: 16/386,893

(22) Filed: Apr. 17, 2019

(65) Prior Publication Data

US 2020/0091234 A1    Mar. 19, 2020

(30) Foreign Application Priority Data

Sep. 13, 2018    (KR) .................. 10-2018-0109498

(51) Int. Cl.
*H01L 27/24* (2006.01)
*H01L 45/00* (2006.01)

(52) U.S. Cl.
CPC .......... *H01L 27/2427* (2013.01); *H01L 45/06* (2013.01); *H01L 45/126* (2013.01); *H01L 45/1233* (2013.01); *H01L 45/1625* (2013.01); *H01L 45/143* (2013.01); *H01L 45/144* (2013.01); *H01L 45/146* (2013.01); *H01L 45/147* (2013.01)

(58) Field of Classification Search
CPC . H01L 27/2427; H01L 45/06; H01L 45/1233; H01L 45/126; H01L 45/1625
See application file for complete search history.

(56) References Cited

U.S. PATENT DOCUMENTS

| | | |
|---|---|---|
| 7,364,644 B2 | 4/2008 | Li et al. |
| 8,598,560 B1 | 12/2013 | Milojevic et al. |
| 9,166,158 B2 | 10/2015 | Lengade et al. |
| 9,299,929 B2 | 3/2016 | Gotti et al. |
| 9,716,225 B2 | 7/2017 | Chan et al. |
| 9,837,471 B2 | 12/2017 | Shepard et al. |
| 2013/0187114 A1* | 7/2013 | Kai ..................... H01L 45/1273 257/3 |

(Continued)

OTHER PUBLICATIONS

Bras, P, "Sputtering-based processes for thin film chalcogenide solar cells on steel substrates", 2017, Digital Comprehensive Summaries of Uppsala Desertions from the Faculty of Science and Technology 1564, pp. 1-108 (108 total pages).

(Continued)

*Primary Examiner* — Mohammad M Choudhry
(74) *Attorney, Agent, or Firm* — Sughrue Mion, PLLC

(57) ABSTRACT

A switching element includes a lower barrier electrode disposed on a substrate, a switching pattern disposed on the lower barrier electrode, and an upper barrier electrode disposed on the switching pattern. The switching pattern includes a first switching pattern, and a second switching pattern disposed on the first switching pattern and having a density different from a density of the first switching pattern.

10 Claims, 18 Drawing Sheets

(56) References Cited

U.S. PATENT DOCUMENTS

2016/0093804 A1    3/2016  Petz et al.
2018/0375021 A1*  12/2018  Wang .................. H01L 27/2472

OTHER PUBLICATIONS

Ciocchini, N., "Modeling of Threshold-Voltage Drift in Phase-Change Memory (PCM) Devices", Nov. 2012, IEEE Transactions on Electron Devices, vol. 59, No. 11, pp. 3084-3090 (7 pages total).
Cuomo, J. and Gambino, R., "Incorporation of rare gases in sputtered amorphous metal films", 1977, The American Vacuum Society, vol. 14, No. 1, pp. 152-157 (7 pages total).
Lelmini, D. and Zhang, Y., "Analytical model for subthreshold conduction and threshold switching in chalcogenide-based memory devices", 2007, American Institute of Physics, pp. 054517-1-054517-13 (14 pages total).

* cited by examiner

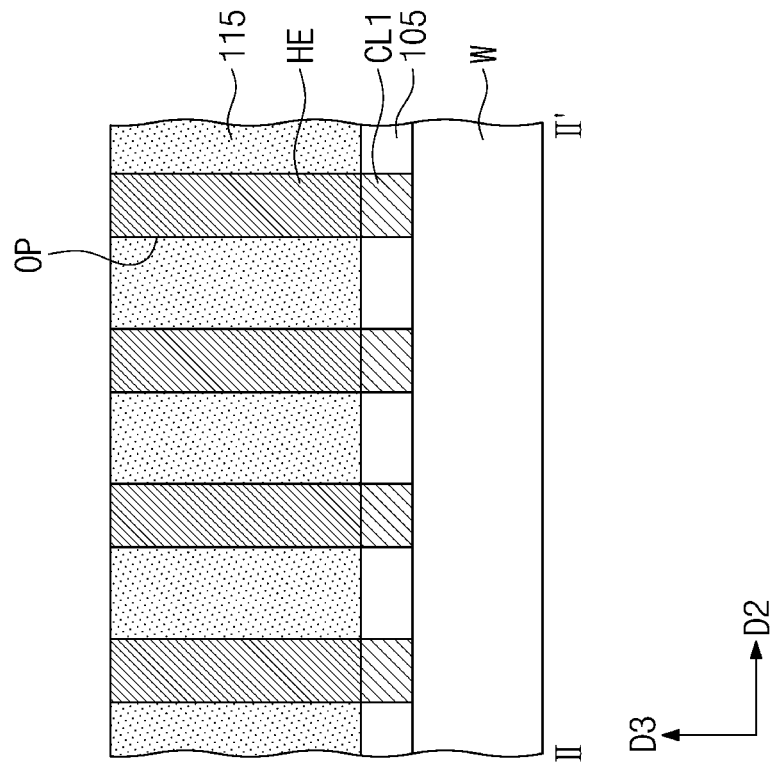
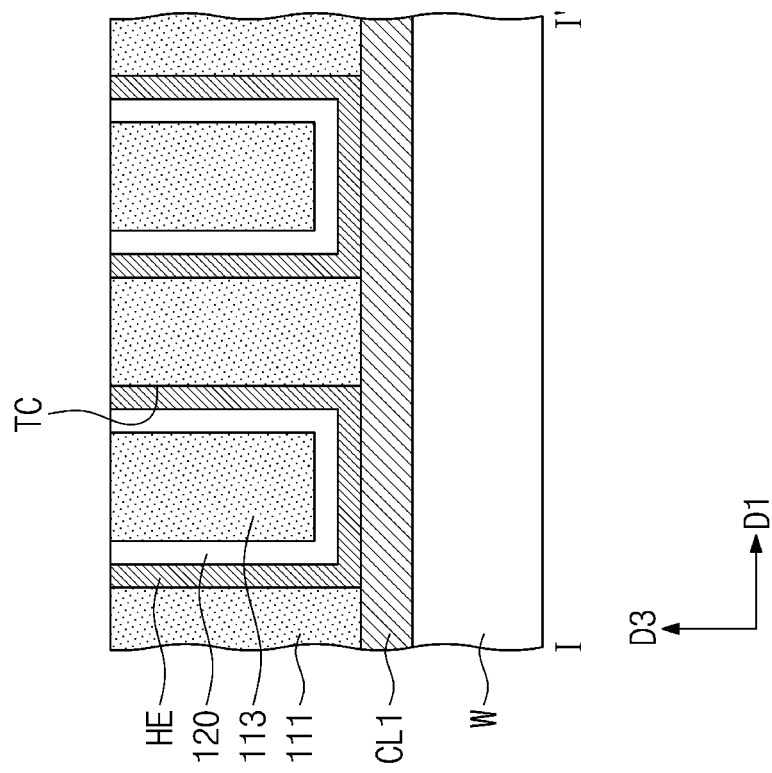

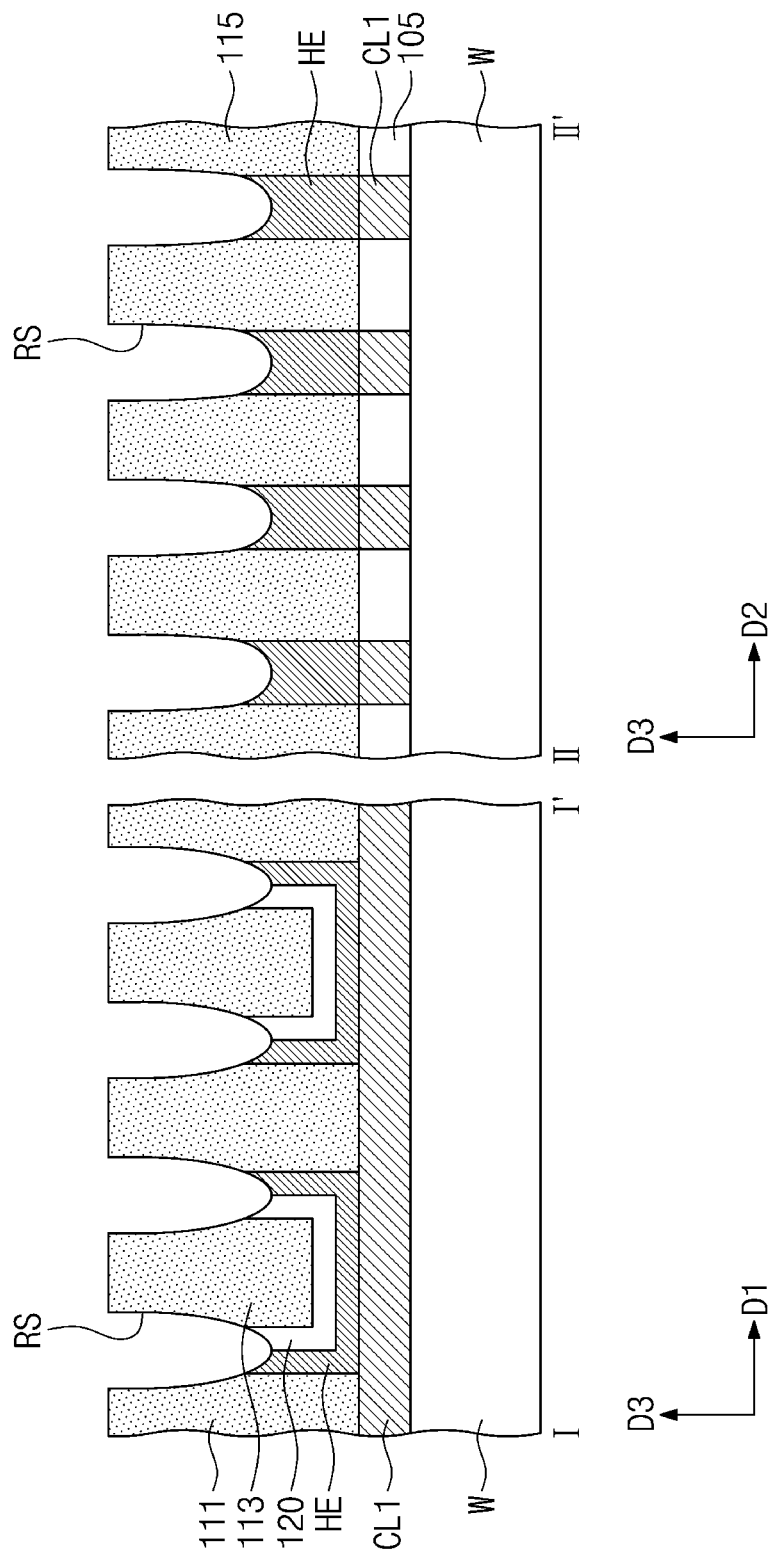

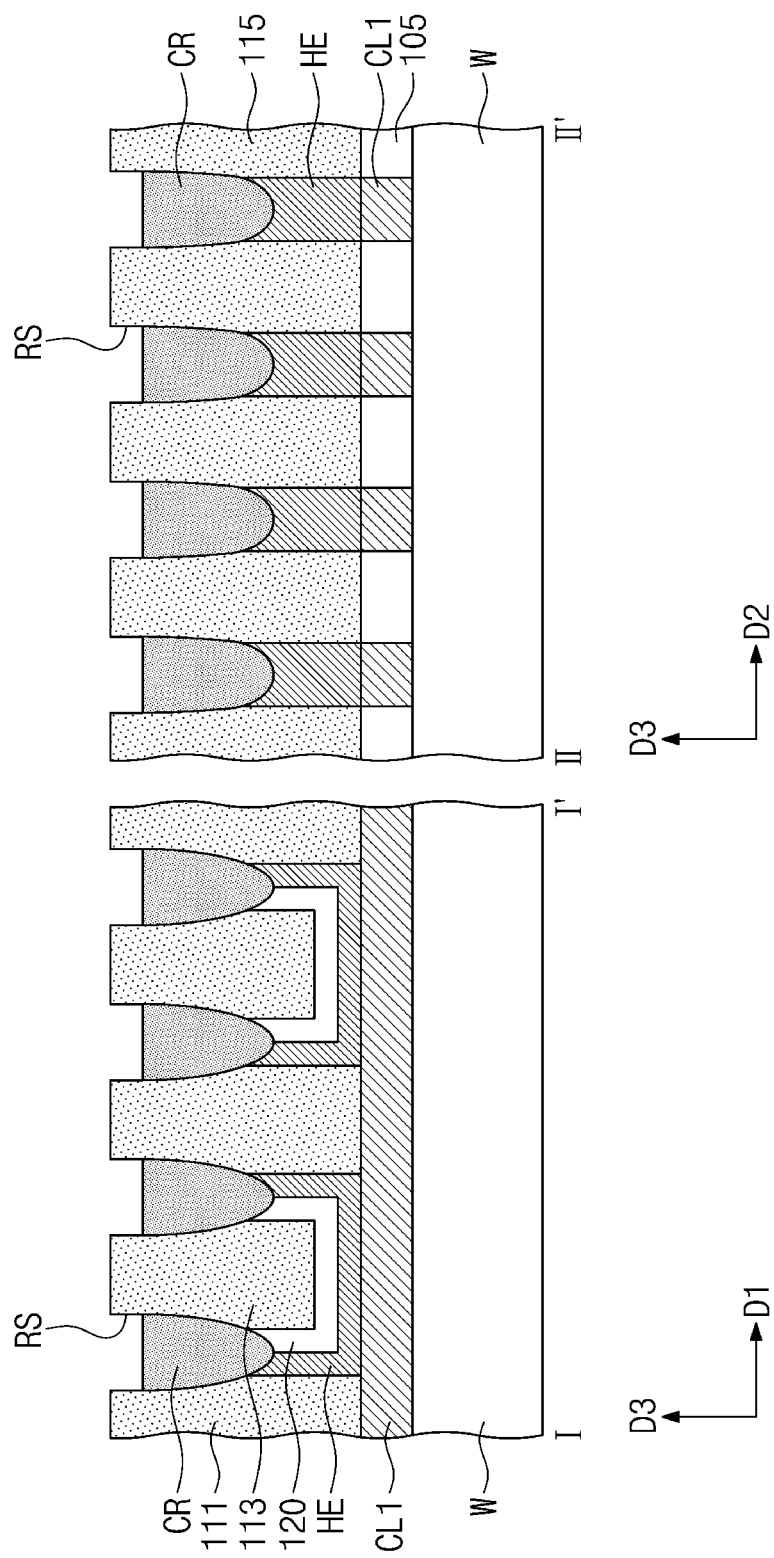

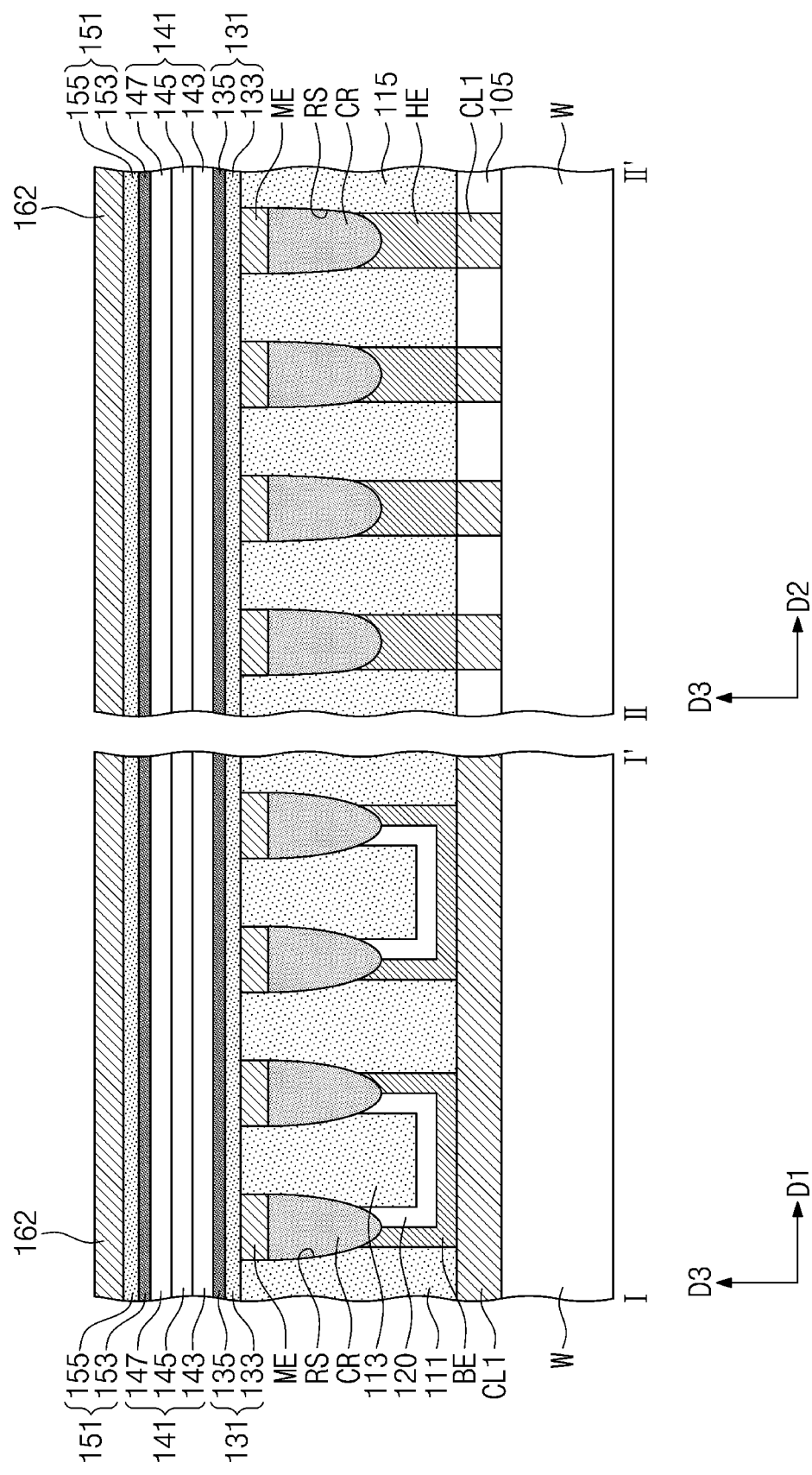

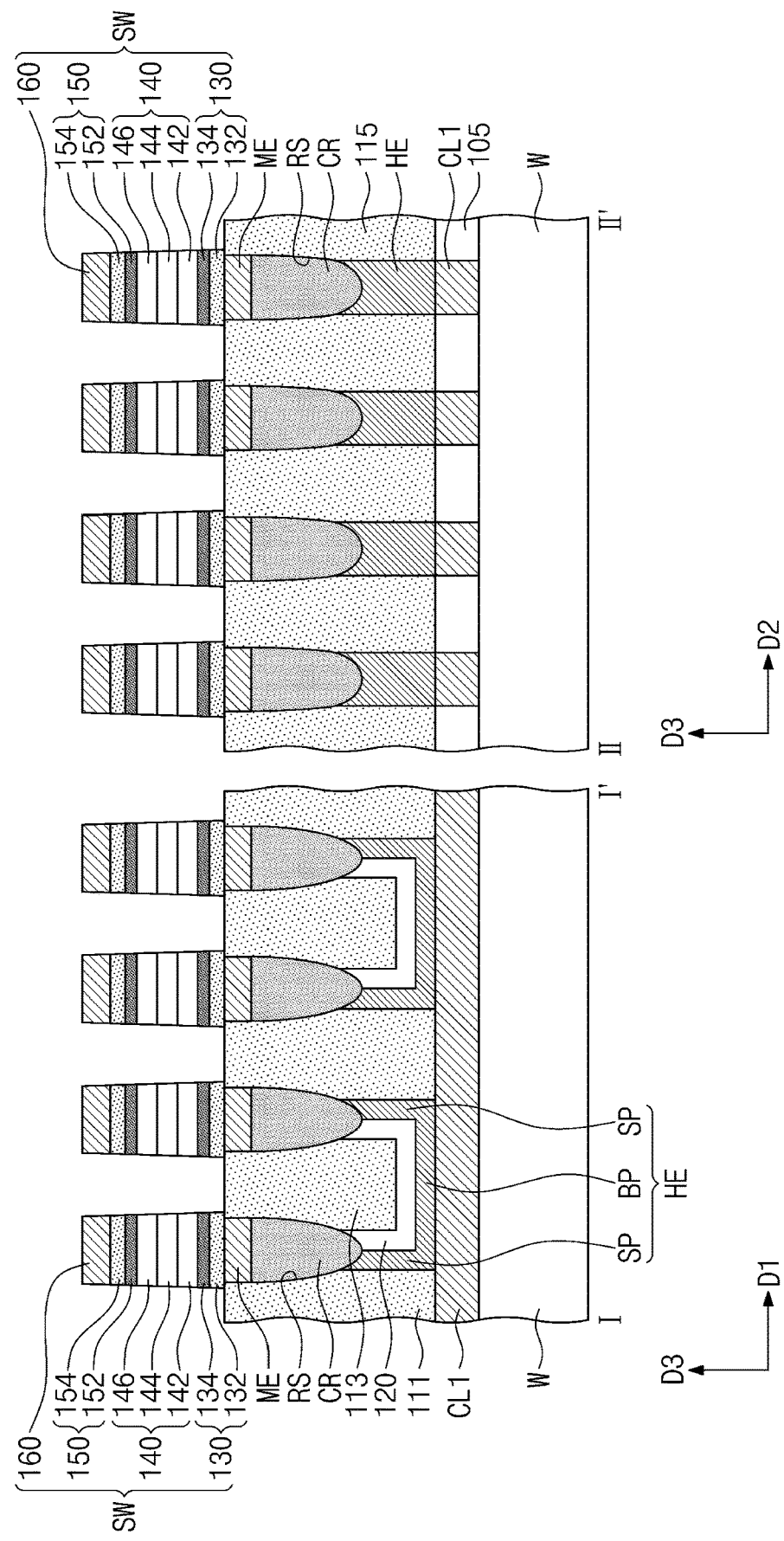

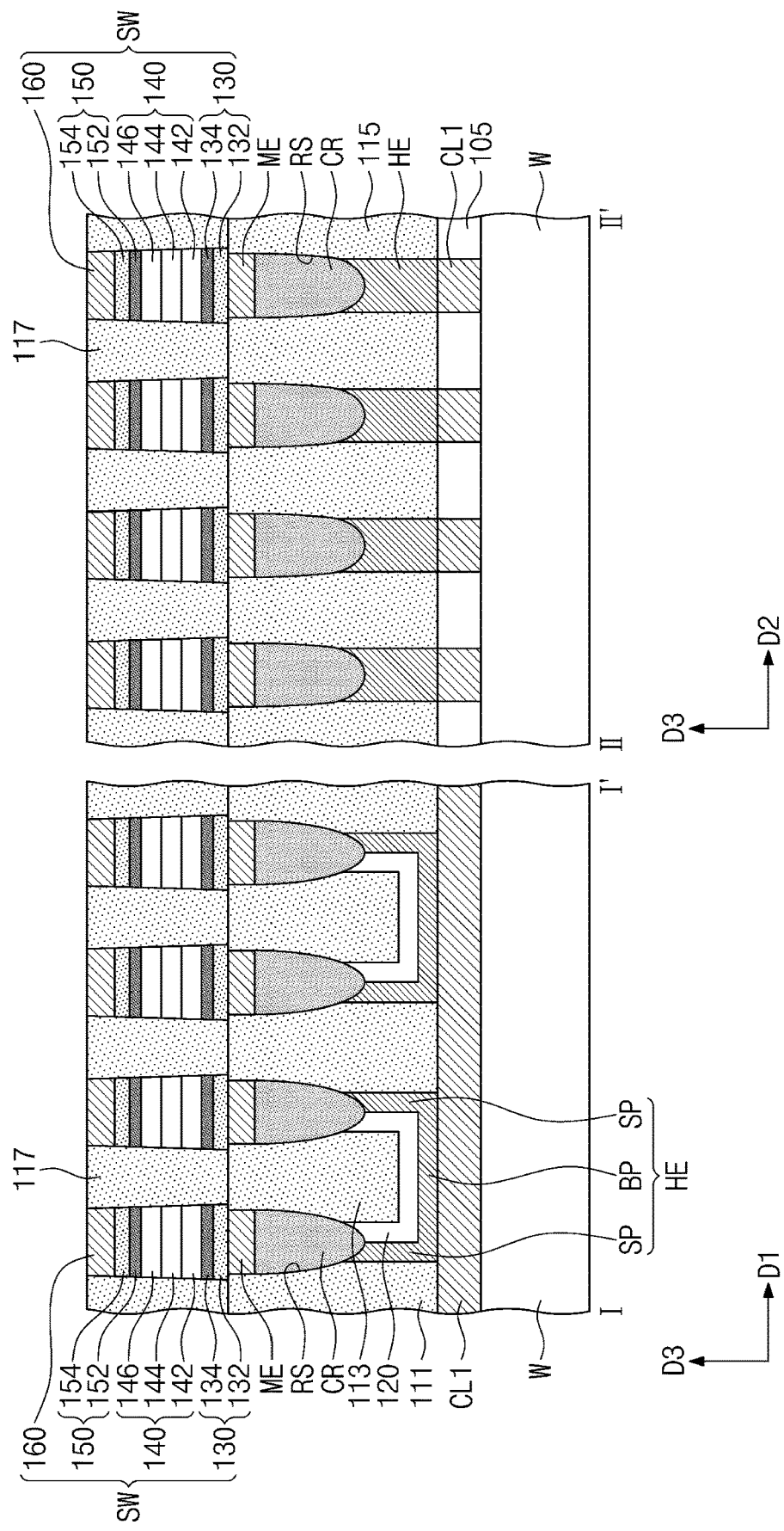

SWITCHING ELEMENT, VARIABLE RESISTANCE MEMORY DEVICE, AND METHOD OF MANUFACTURING THE SWITCHING ELEMENT

CROSS-REFERENCE TO THE RELATED APPLICATION

This application claims priority from Korean Patent Application No. 10-2018-0109498, filed on Sep. 13, 2018, in the Korean Intellectual Property Office, the disclosure of which is incorporated herein in its entirety by reference.

BACKGROUND

Apparatuses and methods consistent with exemplary embodiments of the inventive concepts relate to a semiconductor and, more particularly, to a switching element, an a variable resistance memory device.

Semiconductor memory devices may be classified into volatile memory devices and non-volatile memory devices. The volatile memory devices may lose their stored data when their power supplies are interrupted. For example, the volatile memory devices may include dynamic random access memory (DRAM) devices and static random access memory (SRAM) devices. On the contrary, the non-volatile memory devices may retain their stored data even when their power supplies are interrupted. For example, the non-volatile memory devices may include programmable ROM (PROM), erasable PROM (EPROM), electrically EPROM (EEPROM), and a flash memory device.

Next-generation semiconductor memory devices (e.g., ferroelectric random access memory (FRAM) devices, magnetic random access memory (MRAM) devices, and phase-change random access memory (PRAM) devices) have been developed to provide high-performance and low power consumption semiconductor memory devices. Materials of these next-generation semiconductor memory devices may have resistance values variable according to currents or voltages applied thereto, and may retain their resistance values even when currents or voltages are interrupted.

SUMMARY

Example embodiments of the inventive concepts may provide a switching element capable of reducing a leakage current and of increasing uniformity of a threshold voltage, a variable resistance memory device including the same, and a method of manufacturing the switching element.

According to example embodiments, there is provided a switching element which may include a lower barrier electrode disposed on a substrate, a switching pattern disposed on the lower barrier electrode, and an upper barrier electrode on the switching pattern. The switching pattern may include a first switching pattern, and a second switching pattern disposed on the first switching pattern and having a density different from a density of the first switching pattern.

According to example embodiments, there is provided a variable resistance memory device which may include a first conductive line extending in a first direction, a second conductive line extending in a second direction intersecting the first direction, a variable resistance structure disposed between the first and second conductive lines, and the switching element described above.

According to example embodiments, there is provided a memory device which may include a plurality of memory cell stacks each of which includes a plurality of memory cells. The memory device may further include a plurality of conductive lines disposed between the memory cell stacks and connecting the memory cells. Each of the memory cells may include a variable resistance structure formed of a material of which a phase is reversibly changeable between a crystalline phase and an amorphous phase according to a temperature, and a switching element connecting the variable resistance structure to at least one of the conductive lines. Here, the switching element may include a plurality of layers having different threshold voltages for providing a current or a voltage to the variable resistance structure.

According to example embodiments, there is provided a method of manufacturing a switching element which may include forming a lower barrier layer on a substrate, forming a switching layer on the lower barrier layer, forming an upper barrier layer on the switching layer, and removing portions of the lower barrier layer, the switching layer and the upper barrier layer to form a switching element. The forming of the switching layer may include forming a first switching layer, and forming a second switching layer on the first switching layer, wherein the second switching layer has a different density from a density of the first switching layer.

According to example embodiments, there is provided a method of manufacturing a switching element which may include forming a lower barrier layer on a substrate, forming a switching layer on the lower barrier layer and forming an upper barrier layer on the switching layer. The forming of the switching layer comprises forming a high density switching layer on the lower barrier layer using a Kr gas.

According to example embodiments, there is provided a method of manufacturing a switching element which may include forming a lower barrier layer on a substrate, forming a switching layer on the lower barrier layer and forming an upper barrier layer on the switching layer. The forming of the switching layer comprises forming a high density switching layer including Kr.

BRIEF DESCRIPTION OF THE DRAWINGS

The inventive concepts will become more apparent in view of the attached drawings and accompanying detailed description of example embodiments.

FIGS. 10A-10B to 18A-18B are cross-sectional views taken along the lines I-I' and II-II' of FIG. 3, respectively, to illustrate the method of manufacturing the variable resistance memory device of FIG. 3, according to example embodiments.

DETAILED DESCRIPTION OF THE EXAMPLE EMBODIMENTS

The embodiments described herebelow are all exemplary, and thus, the inventive concepts are not limited to these embodiments disclosed below and may be realized in various other forms.

It will be understood that when an element or layer is referred to as being "over," "above," "on," "connected to" or "coupled to" another element or layer, it can be directly over, above, on, connected or coupled to the other element or layer or intervening elements or layers may be present. In contrast, when an element is referred to as being "directly over," "directly above," "directly on," "directly connected to" or "directly coupled to" another element or layer, there are no intervening elements or layers present. Like numerals refer to like elements throughout. As used herein, the term "and/or" includes any and all combinations of one or more of the associated listed items.

Figure 1:
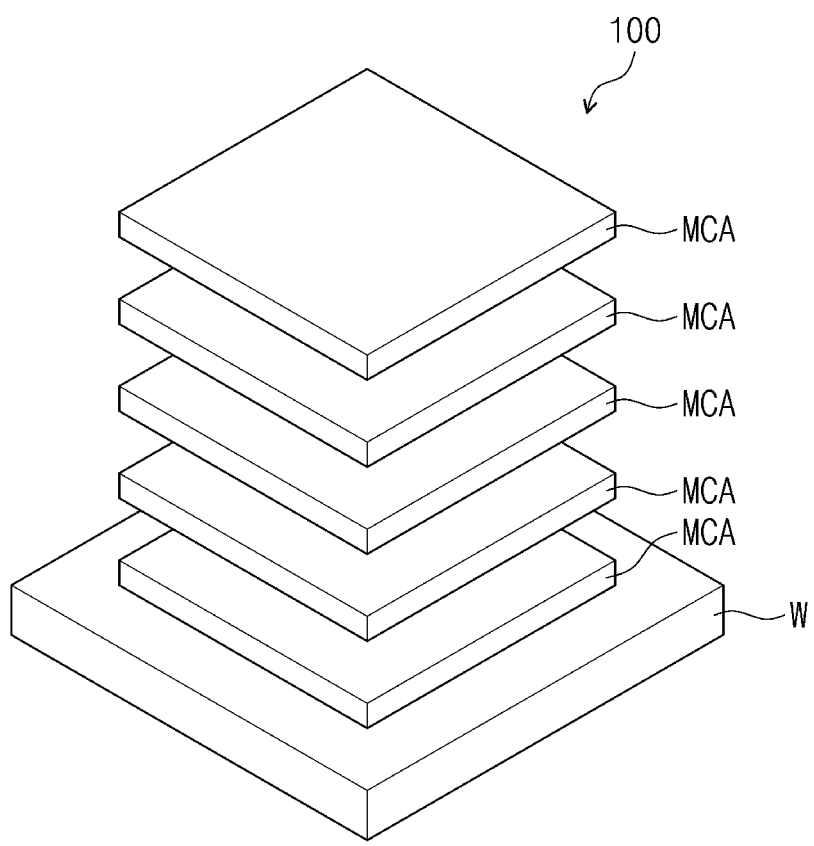
FIG. 1 is a conceptual view illustrating a variable resistance memory device according to some example embodiments.

FIG. 1 is a conceptual view illustrating a variable resistance memory device 100 according to some embodiments.

Referring to FIG. 1, a variable resistance memory device 100 according to some embodiments may include a plurality of memory cell stacks MCA sequentially stacked on a substrate W. Each of the memory cell stacks MCA may include a plurality of variable resistance memory cells two-dimensionally arranged. The variable resistance memory device 100 according to some embodiments may further include conductive lines (not shown) which are disposed between the memory cell stacks MCA and are used to write, read and/or erase the variable resistance memory cells. FIG. 1 illustrates five memory cell stacks MCA. However, the inventive concepts are not limited thereto.

Figure 2:
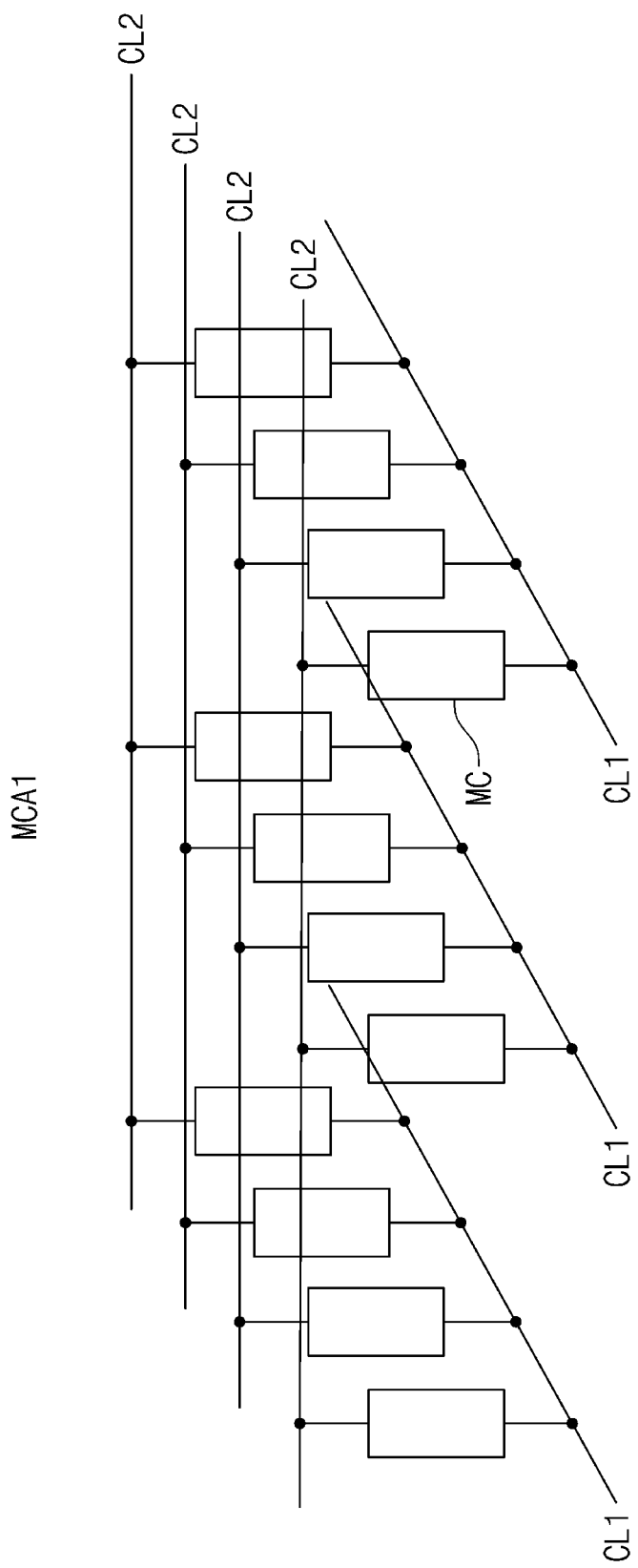
FIG. 2 is a circuit diagram illustrating a memory cell stack of FIG. 1.

FIG. 2 is a circuit diagram illustrating the memory cell stack of FIG. 1. A first memory cell stack MCA1 is illustrated as an example in FIG. 2. The first memory cell stack MCA1 may include memory cells MC disposed at intersecting points of first conductive lines CL1 and second conductive lines CL2. Even though not shown in FIG. 2, a second memory cell stack may be provided on the first memory cell stack MCA1. Like the first memory cell stack MCA1, the second memory cell stack may include memory cells provided at intersecting points of third conductive lines and fourth conductive lines. For example, the third conductive lines may be separate conductive lines vertically spaced apart from the second conductive lines CL2. Alternatively, the second memory cell stack may share the second conductive lines CL2 with the first memory cell stack MCA1. In this case, the third conductive lines may correspond to the second conductive lines CL2. The memory cells MC of the first memory cell stack MCA1 may be two-dimensionally arranged on the substrate W to constitute rows and columns.

Figure 3:
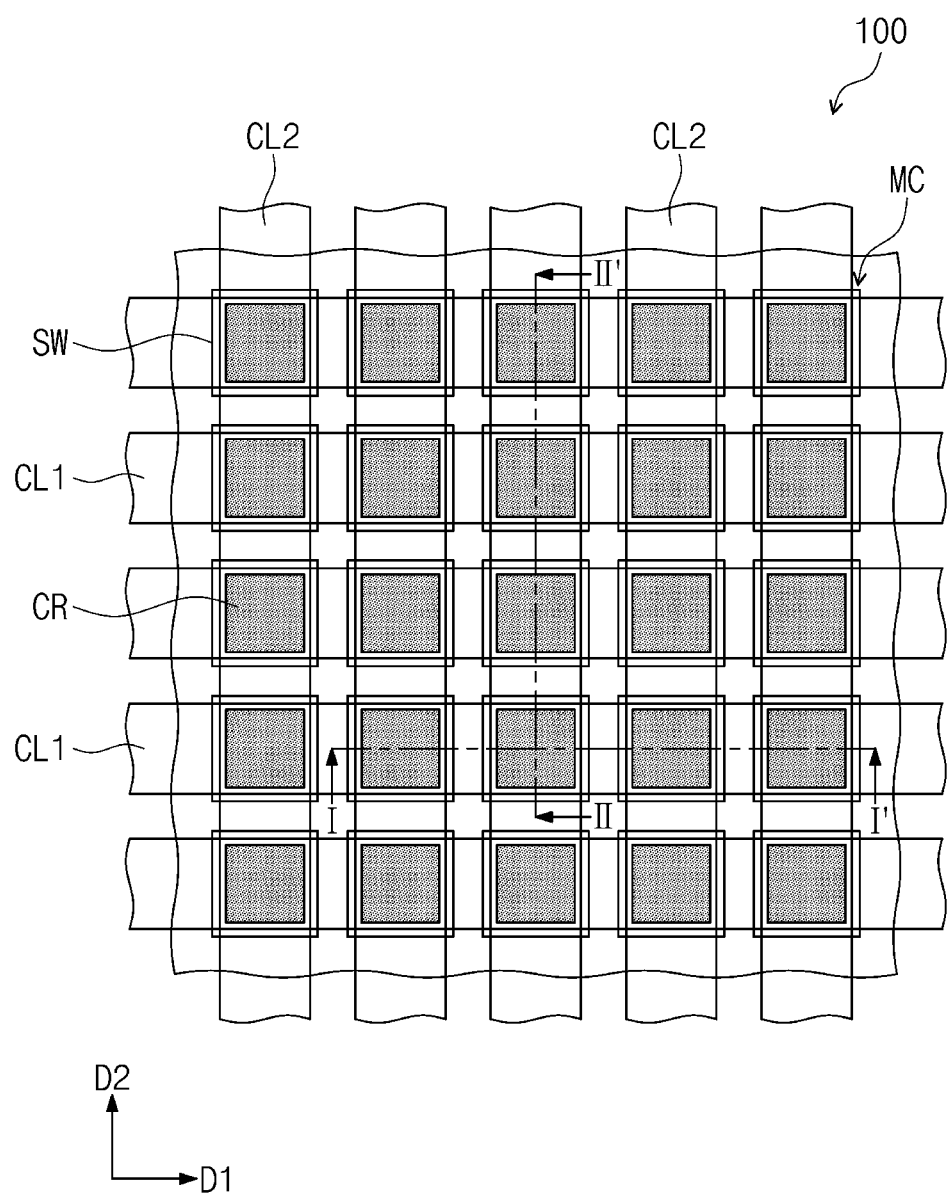
FIG. 3 is a plan view illustrating an example embodiment of first and second conductive lines and memory cells of FIG. 2.

FIG. 3 is a plan view illustrating an embodiment of the first and second conductive lines CL1 and CL2 and the memory cells MC of FIG. 2. FIGS. 4A-4B are cross-sectional views taken along lines I-I' and II-II' of FIG. 3, respectively.

Referring to FIGS. 3 and 4A-4B, the first conductive lines CL1 may extend in a first direction D1 on the substrate W, and the second conductive lines CL2 may extend in a second direction D2 on the substrate W. The substrate W may include a single-crystalline semiconductor material. For example, the substrate W may be a silicon substrate, a silicon-on-insulator (SOI) substrate, a germanium substrate, a germanium-on-insulator (GOI) substrate, or a silicon-germanium (SiGe) substrate. The first conductive lines CL1 may be word lines, and the second conductive lines CL2 may be bit lines. Alternatively, the first conductive lines CL1 may be bit lines, and the second conductive lines CL2 may be word lines. The first and second conductive lines CL1 and CL2 may include a conductive material such as copper or aluminum. The first and second conductive lines CL1 and CL2 may further include a conductive metal nitride such as TiN or WN. The first conductive lines CL1 may be provided in a lower insulating layer 105. The second conductive lines CL2 may be provided in an upper insulating layer 119. For example, the lower insulating layer 105 and the upper insulating layer 119 may include silicon oxide or silicon oxynitride.

The memory cells MC may be disposed between the first conductive lines CL1 and the second conductive lines CL2. In some embodiments, each of the memory cells MC may include a variable resistance structure CR and a switching element SW. The variable resistance structure CR may be connected to the first conductive line CL1. The variable resistance structure CR may have a resistance value which is variable to store data. The switching element SW may be connected to the second conductive line CL2. The switching element SW may connect the second conductive line CL2 to the variable resistance structure CR by a voltage higher than a threshold voltage ($V_{th}$) of the switching element SW. The memory cell MC may further include an intermediate electrode ME between the variable resistance structure CR and the switching element SW. The variable resistance structure CR may be provided between the switching element SW and the substrate W. Alternatively, the switching element SW may be provided between the variable resistance structure CR and the substrate W. Hereinafter, the embodiment in which the variable resistance structure CR is provided between the first conductive line CL1 and the switching element SW will be described for the purpose of ease and convenience in explanation. However, embodiments are not limited thereto.

The variable resistance structure CR may be provided in a recess region RS formed in first to third interlayer insulating layers 111, 113 and 115 on the first conductive line CL1. For example, the first to third interlayer insulating layers 111, 113 and 115 may include silicon nitride or silicon oxynitride. A plurality of the recess regions RS may be respectively disposed at intersecting points of the first conductive lines CL1 and the second conductive lines CL2, and may be two-dimensionally arranged, when viewed in a plan view. Alternatively, the variable resistance structure CR may have a line shape extending in the first direction D1 or the second direction D2.

The variable resistance structure CR may be formed of at least one of materials having properties capable of storing data. When the variable resistance memory device 100 according to some embodiments is a phase change memory device, the variable resistance structure CR may include a material of which a phase is reversibly changeable between a crystalline phase and an amorphous phase according to a temperature.

For example, a phase transition temperature for phase transition between the crystalline phase and the amorphous phase of the variable resistance structure CR may range from about 250 degrees Celsius to about 350 degrees Celsius. The variable resistance structure CR may be formed of a compound that includes at least one of Te and Se (i.e., chalcogenide elements) and at least one of Ge, Sb, Bi, Pb, Sn, Ag, As, S, Si, In, Ti, Ga, P, O, and C. For example, the variable resistance structure CR may include at least one of GeSbTe, GeTeAs, SbTeSe, GeTe, SbTe, SeTeSn, GeTeSe, SbSeBi, GeBiTe, GeTeTi, InSe, GaTeSe, and InSbTe. In certain embodiments, the variable resistance structure CR may have a superlattice structure in which layers including Ge and layers not including Ge are repeatedly and alternately stacked. For example, the variable resistance structure CR may have a structure in which GeTe layers and SbTe layers are repeatedly and alternately stacked.

In certain embodiments, the variable resistance structure CR may include at least one of perovskite compounds and conductive metal oxides. For example, the variable resistance structure CR may include at least one of niobium oxide, titanium oxide, nickel oxide, zirconium oxide, vanadium oxide, (Pr,Ca)MnO$_3$ (PCMO), strontium-titanium oxide, barium-strontium-titanium oxide, strontium-zirconium oxide, barium-zirconium oxide, and barium-strontium-zirconium oxide. When the variable resistance structure CR includes a transition metal oxide, a dielectric constant of the variable resistance structure CR may be greater than a dielectric constant of silicon oxide. In certain embodiments, the variable resistance structure CR may have a double-layer structure of a conductive metal oxide layer and a tunnel insulating layer or may have a triple-layer structure of a first conductive metal oxide layer, a tunnel insulating layer and a second conductive metal oxide layer. The tunnel insulating layer may include aluminum oxide, hafnium oxide, or silicon oxide.

A heater electrode HE may be provided between the first conductive line CL1 and the variable resistance structure CR. The heater electrode HE may connect a pair of the variable resistance structures CR, adjacent to each other in the first direction D1, to the first conductive line CL1. For example, the heater electrode HE may include a horizontal portion BP connected to the first conductive line CL1, and a pair of vertical portions SP extending from both end portions of the horizontal portion BP to the pair of variable resistance structures CR, respectively. Alternatively, a plurality of the heater electrodes HE may be respectively disposed at the intersecting points of the first conductive lines CL1 and the second conductive lines CL2, and may be two-dimensionally arranged. The heater electrode HE may heat the variable resistance structure CR to change the phase of the variable resistance structure CR. The heater electrode HE may be formed of a material of which a resistivity is greater than that of the first conductive line CL1. For example, the heater electrode HE may include at least one of W, Ti, Al, Cu, C, CN, TiN, TiAlN, TiSiN, TiCN, WN, CoSiN, WSiN, TaN, TaCN, TaSiN, and TiO.

A spacer pattern 120 may be provided between the heater electrode HE and the second interlayer insulating layer 113. The spacer pattern 120 may extend along the horizontal portion BP and the vertical portions SP of the heater electrode HE. For example, the spacer pattern 120 may include silicon oxide and/or silicon oxynitride.

A lower portion of the recess region RS may be occupied by the variable resistance structure CR, and an upper portion of the recess region RS may be occupied by the intermediate electrode ME. The intermediate electrode ME may electrically connect the variable resistance structure CR and the switching element SW, and may prevent the variable resistance structure CR from being in direct contact with the switching element SW. For example, the intermediate electrode ME may include at least one of W, Ti, Al, Cu, C, CN, TiN, TiAlN, TiSiN, TiCN, WN, CoSiN, WSiN, TaN, TaCN, and TaSiN. Top surfaces of the first to third interlayer insulating layers 111, 113 and 115 may be substantially coplanar with a top surface of the intermediate electrode ME. According to an embodiment, the intermediate electrode ME may also be provided on the first to third interlayer insulating layers 111, 113 and 115.

The switching element SW may be disposed between the intermediate electrode ME and the second conductive line CL2. The switching element SW may include an ovonic threshold switch (OTS) element having a bi-directional characteristic. The switching element SW may include an element based on a threshold switching phenomenon having a nonlinear I-V curve (e.g., a S-shaped I-V curve). In some embodiments, the switching element SW may include a lower barrier electrode 130, a switching pattern 140, an upper barrier electrode 150, and an upper electrode 160.

The lower barrier electrode 130 may be disposed between the intermediate electrode ME and the switching pattern 140. The lower barrier electrode 130 may prevent or minimize heat transfer between the intermediate electrode ME and the switching pattern 140. The lower barrier electrode 130 may include multi-electrodes according to a density difference, a resistivity difference, or a surface roughness difference. In some embodiments, the lower barrier electrode 130 may include a first lower barrier electrode 132 and a second lower barrier electrode 134.

The first lower barrier electrode 132 may be disposed between the intermediate electrode ME and the switching pattern 140. The first lower barrier electrode 132 may reduce stress between the intermediate electrode ME and the switching pattern 140, and may increase adhesive strength therebetween. In some embodiments, the first lower barrier electrode 132 may be wider than the intermediate electrode ME in the first direction D1 and/or the second direction D2. The intermediate electrode ME may have a first width WD1, and the first lower barrier electrode 132 may have a second width WD2 greater than the first width WD1. Thus, the first lower barrier electrode 132 may also be disposed between the switching pattern 140 and a portion of the first to third interlayer insulating layers 111, 113 and 115. The first lower barrier electrode 132 may reduce stress between the switching pattern 140 and the portion of the first to third interlayer insulating layers 111, 113 and 115, and may increase adhesive strength therebetween. For example, the first lower barrier electrode 132 may include low-density carbon having a density less than about 2.0 g/cm$^3$. For example, the first lower barrier electrode 132 may have a density of about 1.73 g/cm$^3$. The first lower barrier electrode 132 may have a resistivity of about 46.5 mΩ·cm and a surface roughness of about 1.0 nm.

The second lower barrier electrode 134 may be disposed between the first lower barrier electrode 132 and the switching pattern 140. A density of the second lower barrier electrode 134 may be higher than the density of the first lower barrier electrode 132. For example, the second lower barrier electrode 134 may include high-density carbon having a density greater than about 2.0 g/cm$^3$. For example, the second lower barrier electrode 134 may have a density of about 2.34 g/cm$^3$. The second lower barrier electrode 134 may minimize or prevent diffusion of elements included in the switching pattern 140. In addition, the second lower barrier electrode 134 may minimize or prevent intermixing of the first lower barrier electrode 132 and the switching pattern 140. A resistivity of the second lower barrier electrode 134 may be less than the resistivity of the first lower barrier electrode 132. A surface roughness of the second lower barrier electrode 134 may be less than the surface roughness of the first lower barrier electrode 132. For example, the second lower barrier electrode 134 may have a resistivity of about 24.8 mΩ·cm and a surface roughness of about 0.4 nm.

The switching pattern 140 may be disposed on the second lower barrier electrode 134. The switching pattern 140 may have a phase transition temperature, for phase transition between a crystalline phase and an amorphous phase, which is higher than that of the variable resistance structure CR. For example, the phase transition temperature of the switching pattern 140 may range from about 350 degrees Celsius to about 450 degrees Celsius. Thus, when the variable resistance memory device 100 according to the embodiments is operated, the phase of the variable resistance structure CR may be reversibly changed between the crystalline phase and the amorphous phase by an operating voltage (e.g., a program voltage), but a substantially amorphous state of the switching pattern 140 may be maintained without phase change even though the operating voltage is applied thereto. In the present specification, the term 'substantially amorphous state' may include an amorphous state, and may also include a case in which a grain boundary or a crystallized portion locally exists in a portion of a component. For example, the switching pattern 140 may be formed of a compound that includes at least one of Te and Se (i.e., chalcogenide elements) and at least one of Ge, Sb, Bi, Al, Pb, Sn, Ag, As, S, Si, In, Ti, Ga, and P. The switching pattern 140 may further include a thermal stabilization element in addition to the compound. The thermal stabilization element may include at least one of C, N, and O. For example, the switching pattern 140 may include at least one of AsTe, AsSe, GeTe, SnTe, GeSe, SnTe, SnSe, ZnTe, AsTeSe, AsTeGe, AsSeGe, AsTeGeSe, AsSeGeSi, AsSeGeC, AsTeGeSi, AsTeGeS, AsTeGeSiIn, AsTeGeSiP, AsTeGeSiSbS, AsTeGeSiSbP, AsTeGeSeSb, AsTeGeSeSi, AsTeGeSiSeNS, SeTeGeSi, GeSbTeSe, GeBiTeSe, GeAsSbSe, GeAsBiTe, and GeAsBiSe.

In addition, the switching pattern 140 may have a multilayered structure including layers distinguished depending on a density difference. For example, the switching pattern 140 may include a first switching pattern 142 and a second switching pattern 144. The first switching pattern 142 may be disposed on the second lower barrier electrode 134. The second switching pattern 144 may be disposed on the first switching pattern 142.

Figure 4:
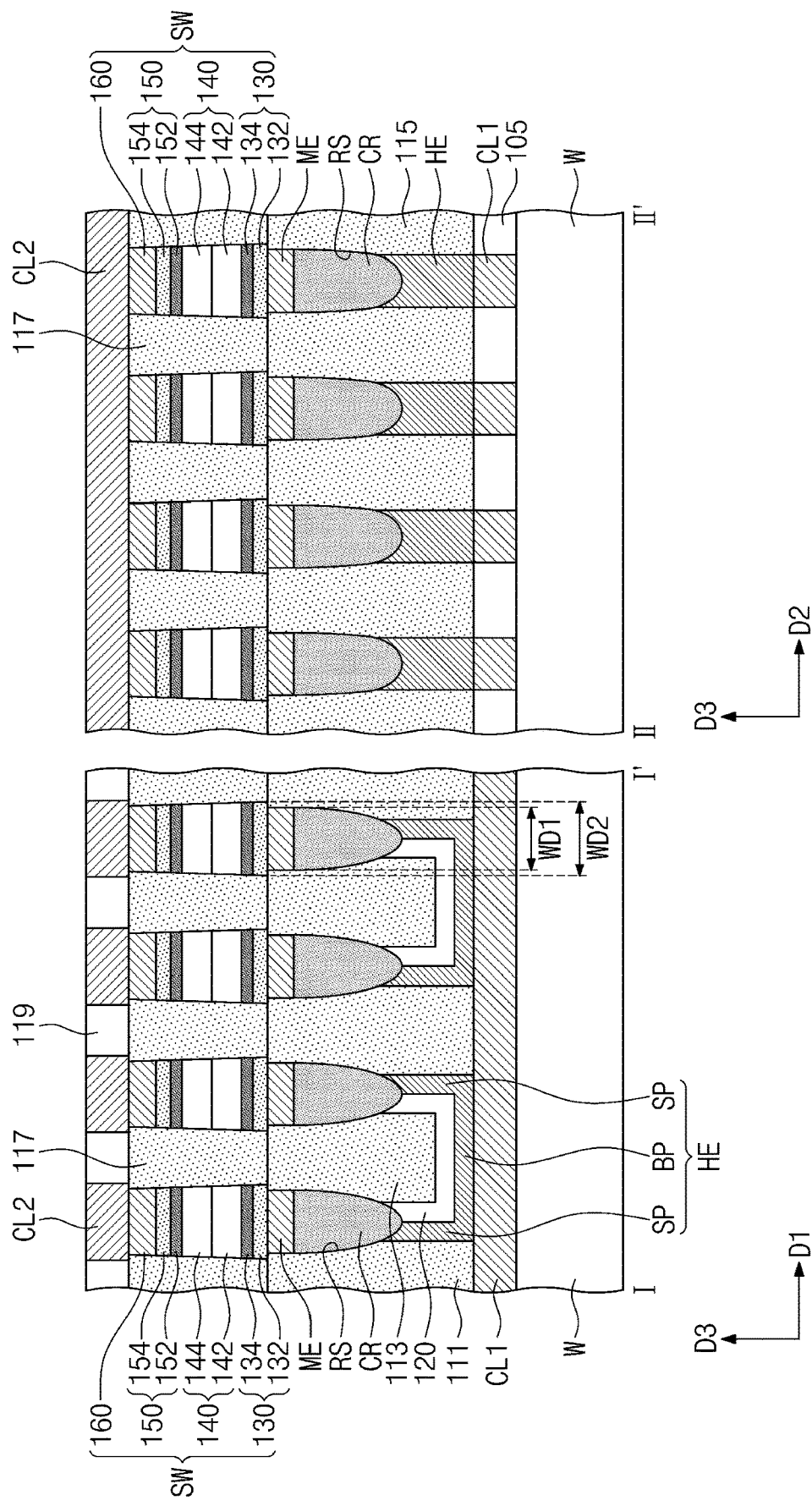
FIGS. 4A-4B are cross-sectional views taken along lines I-I' and II-II' of FIG. 3, respectively, according to example embodiments.
Figure 5:
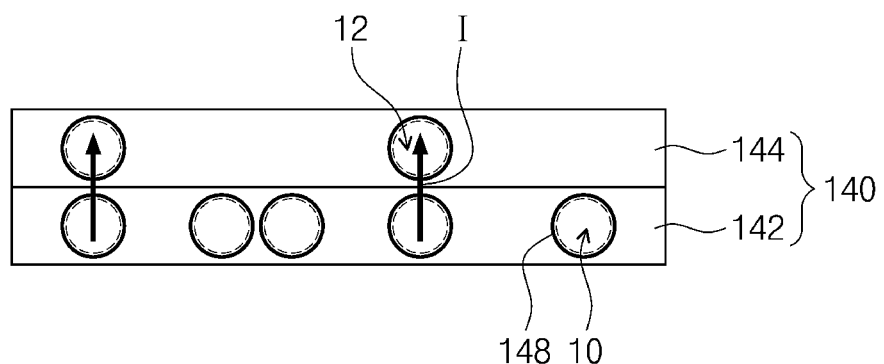
FIGS. 5 and 6 are cross-sectional views illustrating some example embodiments of first and second switching patterns of FIG. 4.
Figure 6:
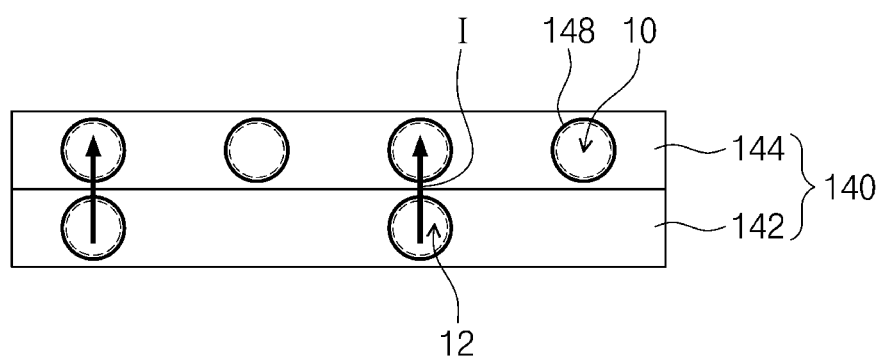

FIGS. 5 and 6 are cross-sectional views illustrating some embodiments of the first and second switching patterns 142 and 144 of FIG. 4.

Referring to FIGS. 5 and 6, a density of the second switching pattern 144 may be different from a density of the first switching pattern 142. For example, the first and second switching patterns 142 and 144 may have voids 148, and the densities of the first and second switching patterns 142 and 144 may be determined depending on the numbers and/or sizes of the voids 148. The numbers and/or sizes of the voids 148 may be inversely proportional to the densities of the first and second switching patterns 142 and 144. As the number of the void(s) 148 increases, the density may decrease. As the number of the void(s) 148 decreases, the density may increase.

The first and second switching patterns 142 and 144 may contain different inert gases. For example, each of the first and second switching patterns 142 and 144 may contain a first inert gas 10 or a second inert gas 12, which remains in the void 148. The first and second inert gases 10 and 12 may be gases remaining in forming the first and second switching patterns 142 and 144. The first and second inert gases 10 and 20 may have different atomic weights. For example, the atomic weight of the first inert gas 10 may be less than the atomic weight of the second inert gas 12. In other words, the first inert gas 10 may be lighter than the second inert gas 12. A sticking coefficient of the second inert gas 12 may be less than a sticking coefficient of the first inert gas 10. Thus, the number of the void(s) 148 generated by the second inert gas 12 may be less than the number of the voids 148 generated by the first inert gas 10. For example, the first inert gas 10 may include an argon (Ar) gas, and the second inert gas 12 may include a krypton (Kr) gas. In addition, the second inert gas 12 may further include a xenon (Xe) gas or a radon (Rn) gas.

Referring to FIG. 5, the number of the voids 148 in the first switching pattern 142 may be greater than the number of the voids 148 in the second switching pattern 144. In other words, the first switching pattern 142 may have a low density, and the second switching pattern 144 may have a high density. In addition, the first switching pattern 142 may contain the first inert gas 10, and the second switching pattern 144 may contain the second inert gas 12. The void 148 may function as a path of a current I or may act as a trap.

When the void 148 functions as the path of the current I, the first switching pattern 142 having the low density may have a threshold voltage ($V_{th}$) lower than a threshold voltage ($V_{th}$) of the second switching pattern 144 having the high density. This may be because a distance between the voids 148 in the first switching pattern 142 having the low density is shorter than a distance between the voids 148 in the second switching pattern 144 having the high density. In other words, as the distance between the voids 148 decreases, the threshold voltage ($V_{th}$) may decrease. In addition, the first switching pattern 142 having the low density may compensate deterioration of uniformity of the threshold voltage ($V_{th}$) of the second switching pattern 144 having the high density. For example, the second switching pattern 144 having the high density may deteriorate uniformity of the threshold voltage ($V_{th}$) of the switching element SW by about 11% or more. The first switching pattern 142 having the low density may improve the uniformity of the threshold voltage ($V_{th}$) of the switching element SW to about 4.7% or less, and thus reliability of the switching element SW may be improved.

When the void 148 acts as the trap, a leakage current of the second switching pattern 144 having the high density may be less than a leakage current of the first switching pattern 142 having the low density. In addition, the second switching pattern 144 having the high density may compensate a leakage current increase caused by the first switching pattern 142 having the low density. For example, the first switching pattern 142 having the low density may increase a leakage current of the switching element SW to about 1.2 nA or more. However, the second switching pattern 144 may reduce the leakage current of the switching element SW to about 0.8 nA or less, and thus a power loss of the switching element SW may be minimized or prevented.

Referring to FIG. 6, in certain embodiments, a density of the second switching pattern 144 may be less than a density of the first switching pattern 142. The second switching pattern 144 having a low density may compensate deterioration of uniformity of a threshold voltage ($V_{th}$) of the first switching pattern 142 having a high density, thereby improving reliability of the switching element SW. The first switching pattern 142 having the high density may compensate a leakage current increase of the second switching pattern 144 having the low density, thereby minimizing or preventing a power loss of the switching element SW. The first switching pattern 142 may contain the second inert gas 12 in the void 148, and the second switching pattern 144 may contain the first inert gas 10 in the void 148.

Referring again to FIG. 4, the upper barrier electrode 150 may be disposed on the switching pattern 140. The upper barrier electrode 150 may minimize or prevent heat transfer between the switching pattern 140 and the second conductive line CL2. The upper barrier electrode 150 may be divided multi-electrodes according to a density difference, a resistivity difference, or a surface roughness difference. In some embodiments, the upper barrier electrode 150 may include a first upper barrier electrode 152 and a second upper barrier electrode 154.

The first upper barrier electrode 152 may be disposed between the switching pattern 140 and the second upper barrier electrode 154. For example, the first upper barrier electrode 152 may include high-density carbon. For example, the first upper barrier electrode 152 may have a density of about 2.34 g/cm$^3$. The first upper barrier electrode 152 may minimize or prevent diffusion of the elements included in the switching pattern 140. The first upper barrier electrode 152 may minimize or prevent intermixing of the switching pattern 140 and the second upper barrier electrode 154. For example, the first upper barrier electrode 152 may have a resistivity of about 24.8 mΩ·cm and a surface roughness of about 0.4 nm.

The second upper barrier electrode 154 may be disposed between the first upper barrier electrode 152 and the upper electrode 160. A density of the second upper barrier electrode 154 may be less than the density of the first upper barrier electrode 152. For example, the second upper barrier electrode 154 may include low-density carbon. For example, the second upper barrier electrode 154 may have a density of about 1.73 g/cm$^3$. The second upper barrier electrode 154 may reduce stress between the first upper barrier electrode 152 and the upper electrode 160, and may increase adhesive strength therebetween. The second upper barrier electrode 154 may have a resistivity of about 46.5 mΩ·cm and a surface roughness of about 1.0 nm.

The upper electrode 160 may be disposed on the second upper barrier electrode 154. The upper electrode 160 may electrically connect the second conductive line CL2 to the switching pattern 140. For example, the upper electrode 160 may include at least one of W, Ti, Al, Cu, C, CN, TiN, TiAlN, TiSiN, TiCN, WN, CoSiN, WSiN, TaN, TaCN, TaSiN, and TiO.

A fourth interlayer insulating layer 117 may be provided to fill a space between the upper electrodes 160. The fourth interlayer insulating layer 117 may be disposed between the upper insulating layer 119 and the first to third interlayer insulating layers 111, 113 and 115. A top surface of the fourth interlayer insulating layer 117 may be substantially coplanar with a top surface of the upper electrode 160. For example, the fourth interlayer insulating layer 117 may include at least one of silicon oxide, silicon nitride, silicon oxynitride, silicon oxycarbide, silicon oxycarbonitride, and silicon carbonitride. The upper insulating layer 119 and the second conductive line CL2 may be provided on the fourth interlayer insulating layer 117.

Figure 7B:
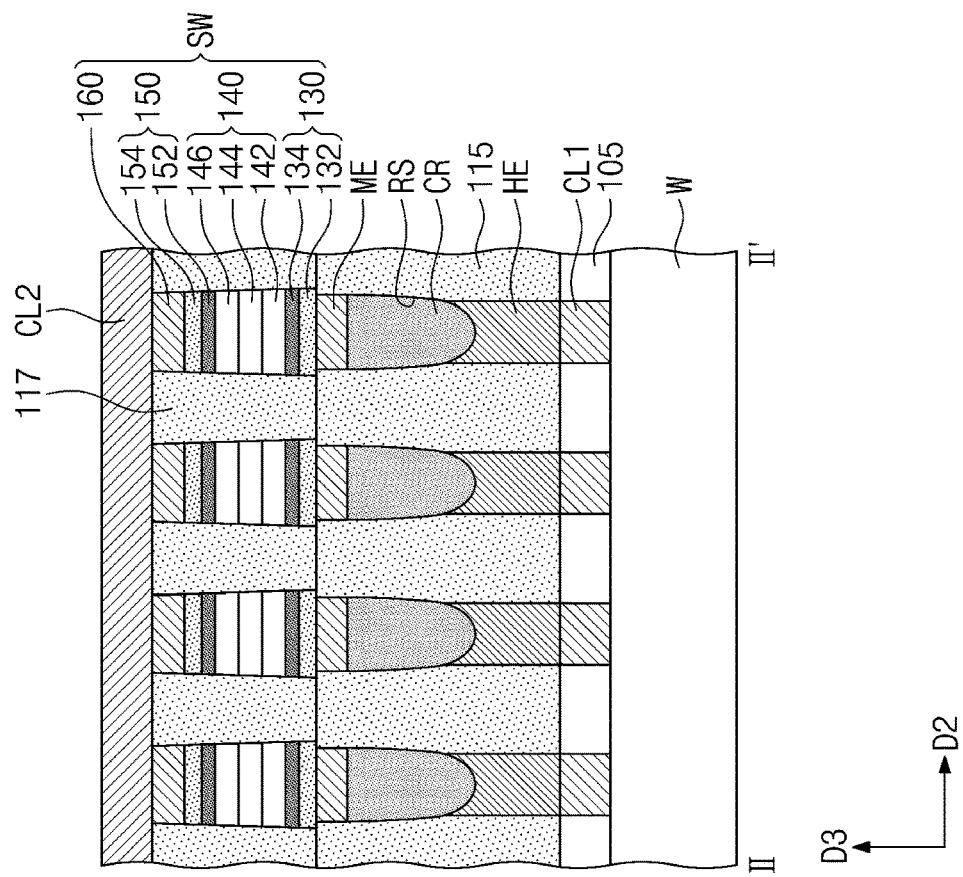
FIGS. 7A-7B are cross-sectional views taken along the lines I-I' and II-II' of FIG. 3 to illustrate a variable resistance memory device according to some example embodiments.
Figure 7A:
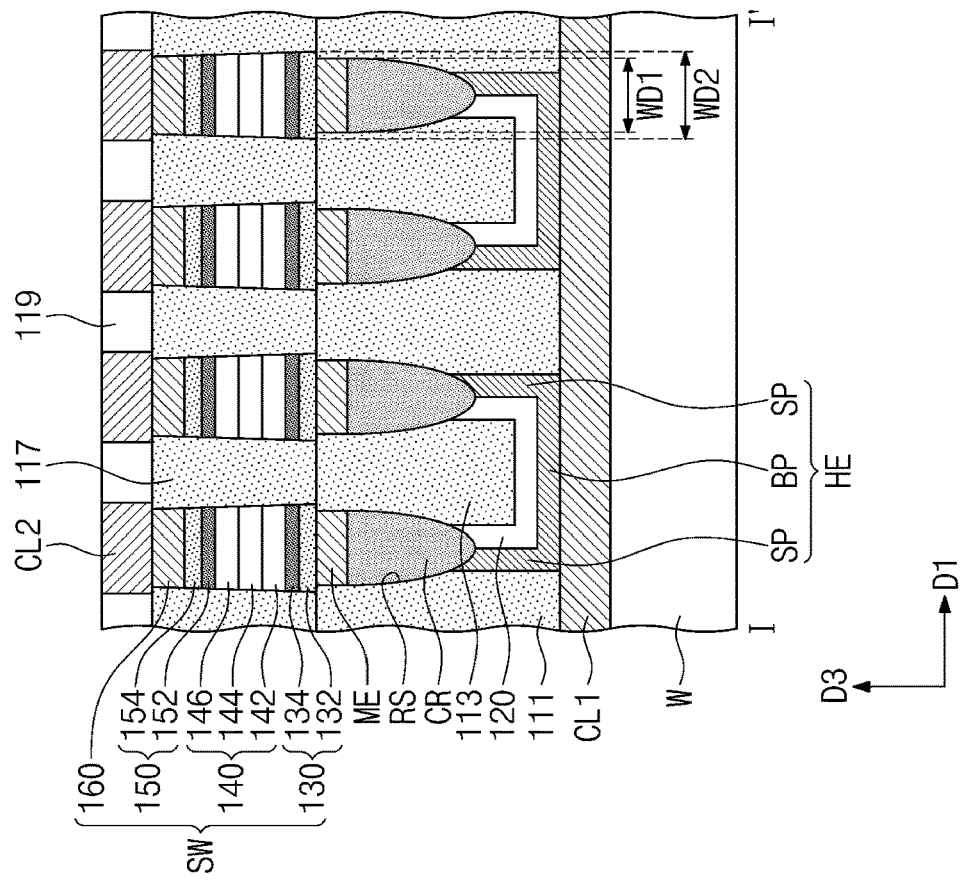

FIGS. 7A-7B are cross-sectional views taken along the lines I-I' and II-II' of FIG. 3, respectively, to illustrate a variable resistance memory device according to some embodiments. Hereinafter, the descriptions to the same elements as in the above embodiments will be omitted for the purpose of ease and convenience in explanation.

Referring to FIGS. 7A-7B, a switching pattern 140 of a switching element SW may further include a third switching pattern 146. The third switching pattern 146 may be disposed between the second switching pattern 144 and the first upper barrier electrode 152.

Figure 8:
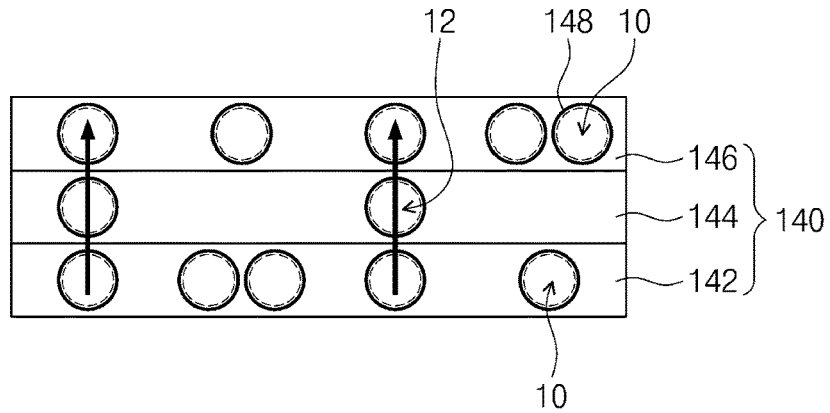
FIG. 8 is a cross-sectional view illustrating an example embodiment of a switching pattern of FIG. 7.

FIG. 8 is a cross-sectional view illustrating an embodiment of the switching pattern 140 of FIGS. 7A-7B.

Referring to FIGS. 7A-7B and 8, the number of the voids 148 distributed in each of the first and third switching patterns 142 and 146 may be greater than the number of the voids 148 distributed in the second switching pattern 144. The first and third switching patterns 142 and 146 may contain the same gas, and the second switching pattern 144 may contain a different gas from the gas of the first and third switching patterns 142 and 146. When the first switching pattern 142 contains a first inert gas 10 and the second switching pattern 144 contains a second inert gas 12, the third switching pattern 146 may contain the first inert gas 10. The first and second inert gases 10 and 20 may have different atomic weights. For example, the atomic weight of the first inert gas 10 may be less than the atomic weight of the second inert gas 12. In other words, the first inert gas 10 may be lighter than the second inert gas 12. A density of the third switching pattern 146 may be less than a density of the second switching pattern 144, and may be equal to a density of the first switching pattern 142. In addition, a surface roughness of each of the first and third switching patterns 142 and 146 may be greater than a surface roughness of the second switching pattern 144. The first and third switching patterns 142 and 146 may increase a surface area of the switching pattern 140. The first and third switching patterns 142 and 146 may increase adhesive strength of the switching pattern 140 with the second lower barrier electrode 134 and the first upper barrier electrode 152.

Even though not shown in the drawings, in certain embodiments, the first and third switching patterns 142 and 146 may contain the second inert gas 12, and the second switching pattern 144 may contain the first inert gas 10. In this case, the number of the voids 148 distributed in the second switching pattern 144 may be greater than the number of the voids 148 distributed in each of the first and third switching patterns 142 and 146. Densities of the first and third switching patterns 142 and 146 may be greater than a density of the second switching pattern 144.

A method of manufacturing the variable resistance memory device 100 according to some embodiments will be described hereinafter.

Figure 9:
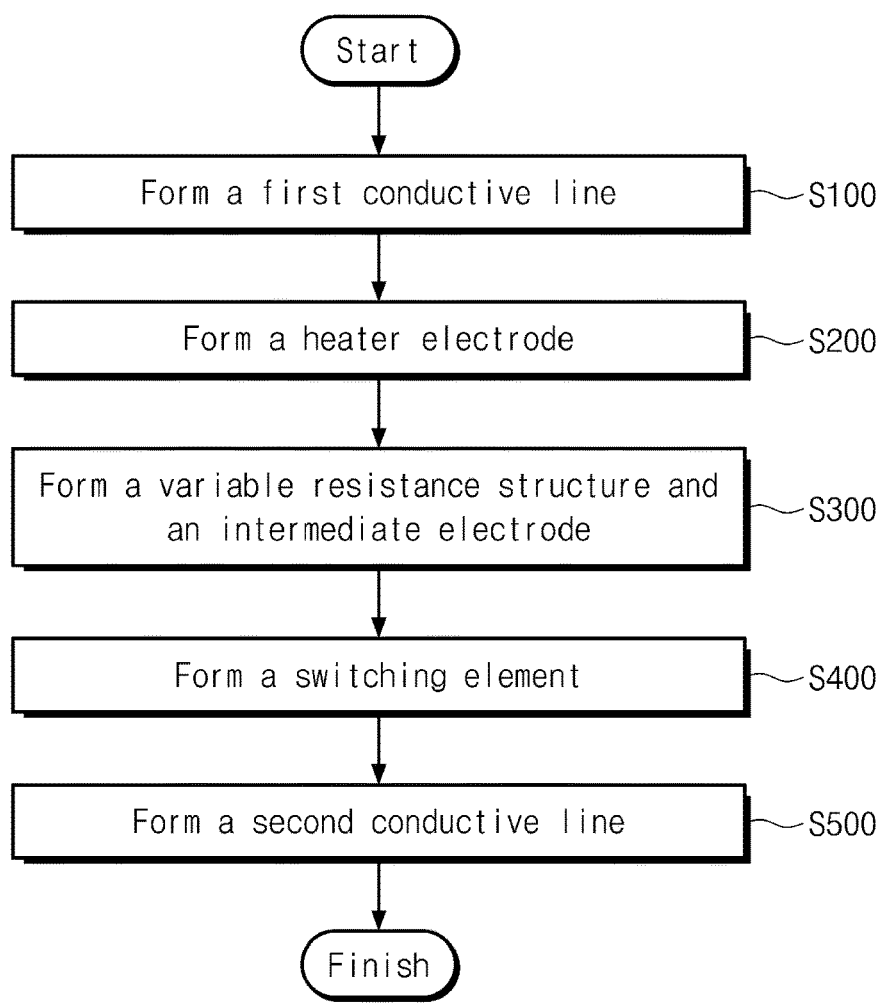
FIG. 9 is a flowchart illustrating a method of manufacturing a variable resistance memory device of FIG. 3, according to an example embodiment.

FIG. 9 is a flowchart illustrating a method of manufacturing the variable resistance memory device 100 of FIG. 3 or FIG. 7.

Referring to FIG. 9, a method of manufacturing the variable resistance memory device 100 according to some embodiments may include forming a first conductive line CL1 (S100), forming a heater electrode HE (S200), forming a variable resistance structure CR and an intermediate electrode ME (S300), forming a switching element SW (S400), and forming a second conductive line CL2 (S500).

FIGS. 10A-10B to 18A-18B are cross-sectional views taken along the lines I-I' and II-II' of FIG. 3, respectively, to illustrate the method of manufacturing the variable resistance memory device of FIG. 3.

Figure 10A:
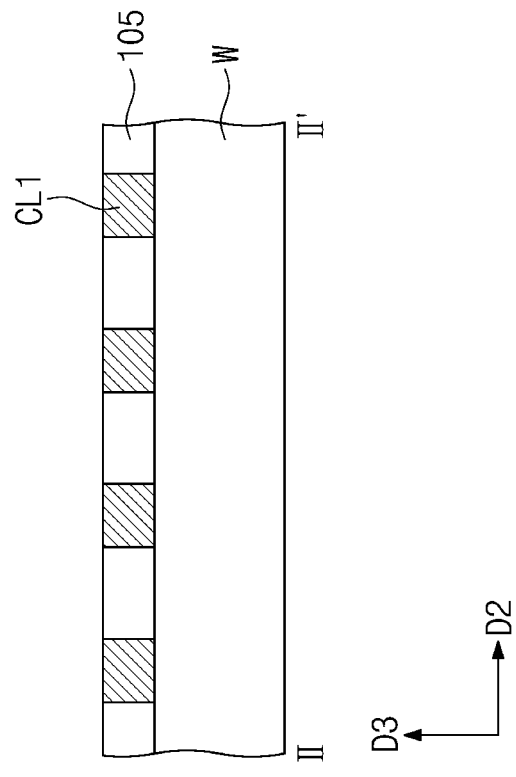
Figure 10B:
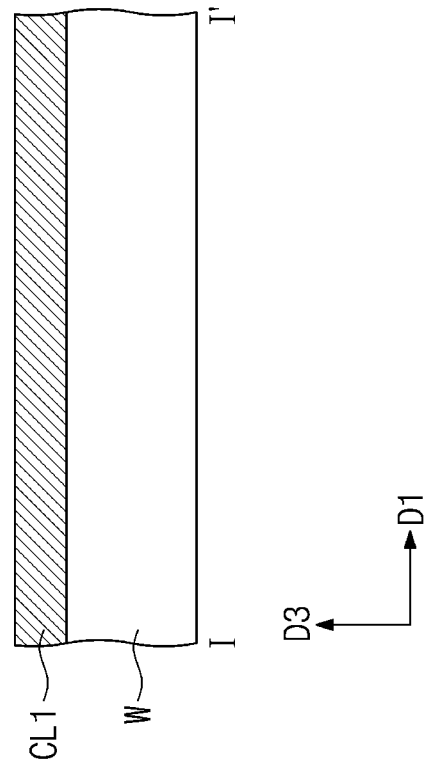

Referring to FIGS. 9 and 10A-10B, the first conductive line CL1 may be formed on a substrate W (S100). In some embodiments, a plurality of the first conductive lines CL1 may be formed by a deposition process of a metal layer, a photolithography process, and an etching process. Thereafter, a lower insulating layer 105 may be formed between the first conductive lines CL1. In certain embodiments, the first conductive line CL1 may be formed by a damascene method. In other words, the lower insulating layer 105 having a lower trench may be formed on the substrate W, and then, the first conductive line CL1 may be formed in the lower trench by a deposition process of a metal layer and a chemical mechanical polishing (CMP) process performed on the metal layer.

Referring to FIGS. 9, 11A-11B and 12A-12B, the heater electrode HE may be formed on the first conductive line CL1 (S200). In some embodiments, the heater electrode HE may be formed using first to third interlayer insulating layers 111, 113 and 115.

Figure 11A:
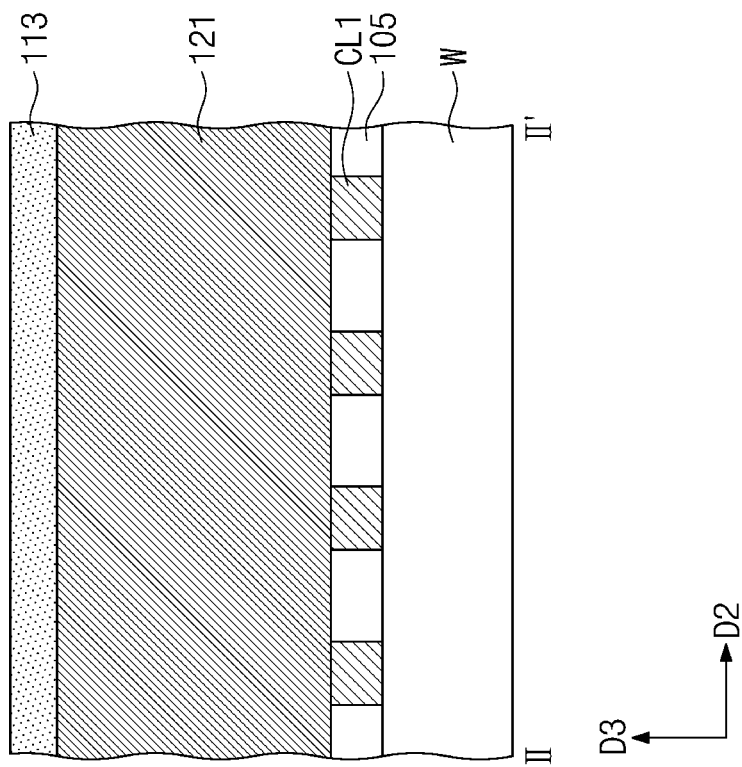
Figure 11B:
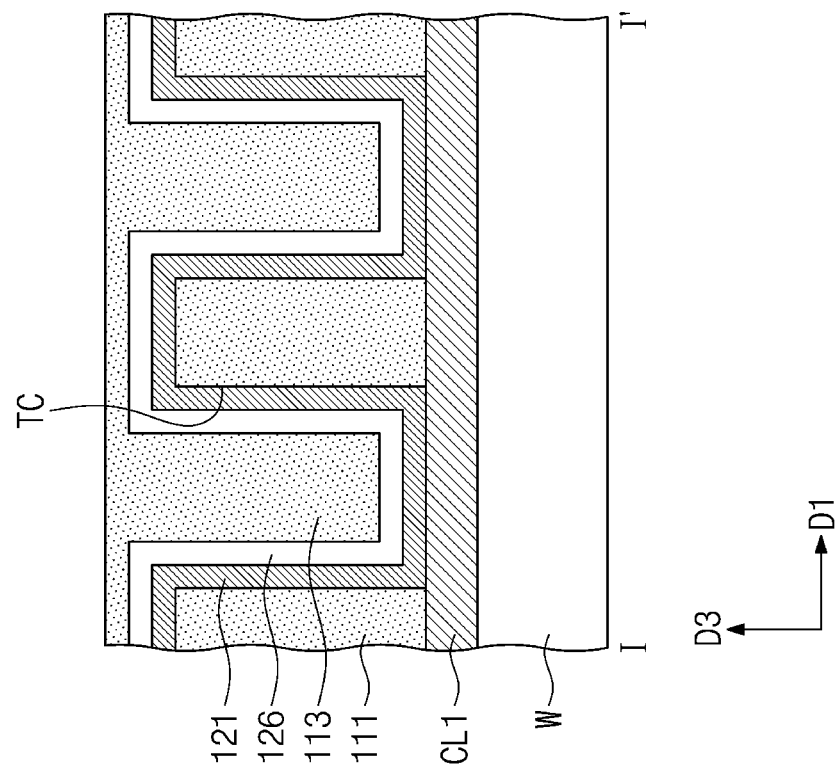

Referring to FIGS. 11A-11B, the first interlayer insulating layer 111 may be formed on the first conductive line CL1 and the lower insulating layer 105. An upper trench TC may be formed in the first interlayer insulating layer 111. A method of forming the upper trench TC may include an anisotropic etching process. The upper trench TC may intersect the first conductive line CL1. For example, the first interlayer insulating layer 111 may be formed of silicon nitride or silicon oxynitride. Next, an electrode layer 121 and a spacer layer 126 may be sequentially formed on the first interlayer insulating layer 111 having the upper trench TC. The electrode layer 121 and the spacer layer 126 may be conformally formed along a shape or profile of the upper trench TC. For example, the electrode layer 121 may include at least one of W, Ti, Al, Cu, C, CN, TiN, TiAlN, TiSiN, TiCN, WN, CoSiN, WSiN, TaN, TaCN, TaSiN, and TiO. For example, the spacer layer 126 may include at least one of silicon oxide and silicon oxynitride. The second interlayer insulating layer 113 filling the upper trench TC may be formed on the spacer layer 126. For example, the second interlayer insulating layer 113 may be formed of the same material as the first interlayer insulating layer 111.

Referring to FIGS. 12A-12B, the second interlayer insulating layer 113, the spacer layer 126 and the electrode layer 121 may be planarized until the first interlayer insulating layer 111 is exposed, thereby forming the heater electrode HE (S200). Thereafter, the first and second interlayer insulating layers 111 and 113, the spacer layer 126 and the electrode layer 121, which do not overlap with the first conductive lines CL1, may be etched to form opening regions OP. As a result, the heater electrode HE may be formed from the electrode layer 121, and a spacer pattern 120 may be formed from the spacer layer 126. A plurality of the heater electrodes HE may be spaced apart from one another in the first direction D1 and the second direction D2. Thereafter, a third interlayer insulating layer 115 may be formed to fill the opening region OP. A method of forming the third interlayer insulating layer 115 may include a deposition process of a dielectric and a CMP process. For example, the third interlayer insulating layer 115 may be formed of the same material as the first interlayer insulating layer 111.

Referring to FIGS. 9, 13A-13B to 15A-15B, the variable resistance structure CR and the intermediate electrode ME may be formed on the heater electrode HE (S300). In some embodiments, the variable resistance structure CR and the intermediate electrode ME may be formed by a damascene method.

Referring to FIGS. 13A-13B, a recess region RS may be formed to expose the heater electrode HE. A method of forming the recess region RS may include a process of etching an upper portion of the spacer pattern 120 and a process of etching an upper portion of the heater electrode HE. Each of the etching processes of the spacer pattern 120 and the heater electrode HE may be a wet etching process. Thereafter, an isotropic wet etching process may be performed to expand an empty space formed by etching the upper portion of the heater electrode HE and the upper portion of the spacer pattern 120. For example, the isotropic wet etching process may be performed using an etchant including phosphoric acid.

Referring to FIGS. 14A-14B, the variable resistance structure CR may be formed in the recess region RS. In some embodiments, a variable resistance layer may be formed to fill the recess region RS, and then, an upper portion of the variable resistance layer may be etched to form the variable resistance structure CR. For example, the variable resistance layer may include at least one of GeSbTe, GeTeAs, SbTeSe, GeTe, SbTe, SeTeSn, GeTeSe, SbSeBi, GeBiTe, GeTeTi, InSe, GaTeSe, and InSbTe. The variable resistance layer may be formed by a physical vapor deposition (PVD) method or a chemical vapor deposition (CVD) method.

Figure 15A:
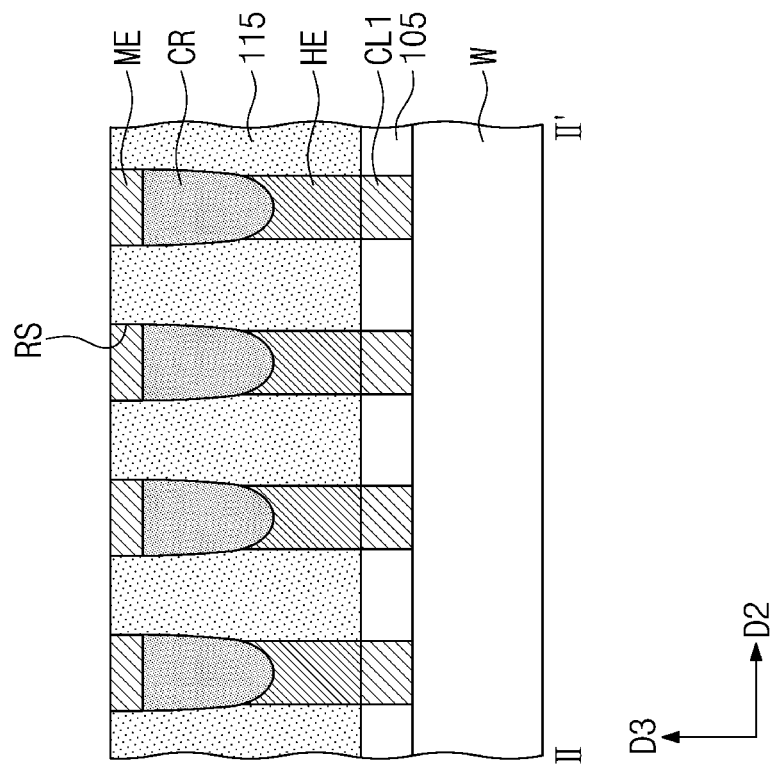
Figure 15B:
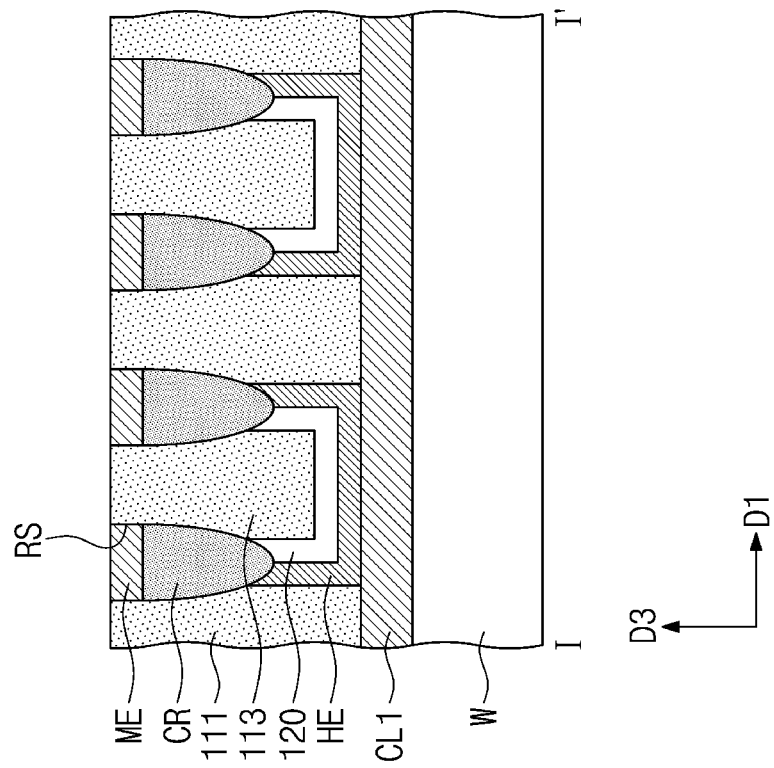

Referring to FIGS. 15A-15B, the intermediate electrode ME may be formed in an upper portion of the recess region RS. In some embodiments, an electrode layer may be formed on the resultant structure having the variable resistance structure CR, and then, a planarization process may be performed on the electrode layer to form the intermediate electrode ME. Alternatively, the process of forming the intermediate electrode ME may be omitted. For example, the intermediate electrode ME may include at least one of W, Ti, Al, Cu, C, CN, TiN, TiAlN, TiSiN, TiCN, WN, CoSiN, WSiN, TaN, TaCN, and TaSiN.

Referring to FIGS. 9, 16A-16B and 17A-17B, the switching element SW may be formed on the resultant structure having the intermediate electrode ME (S400). The switching element SW may be formed through a thin layer deposition process, a photolithography process, and an etching process.

Figure 19:
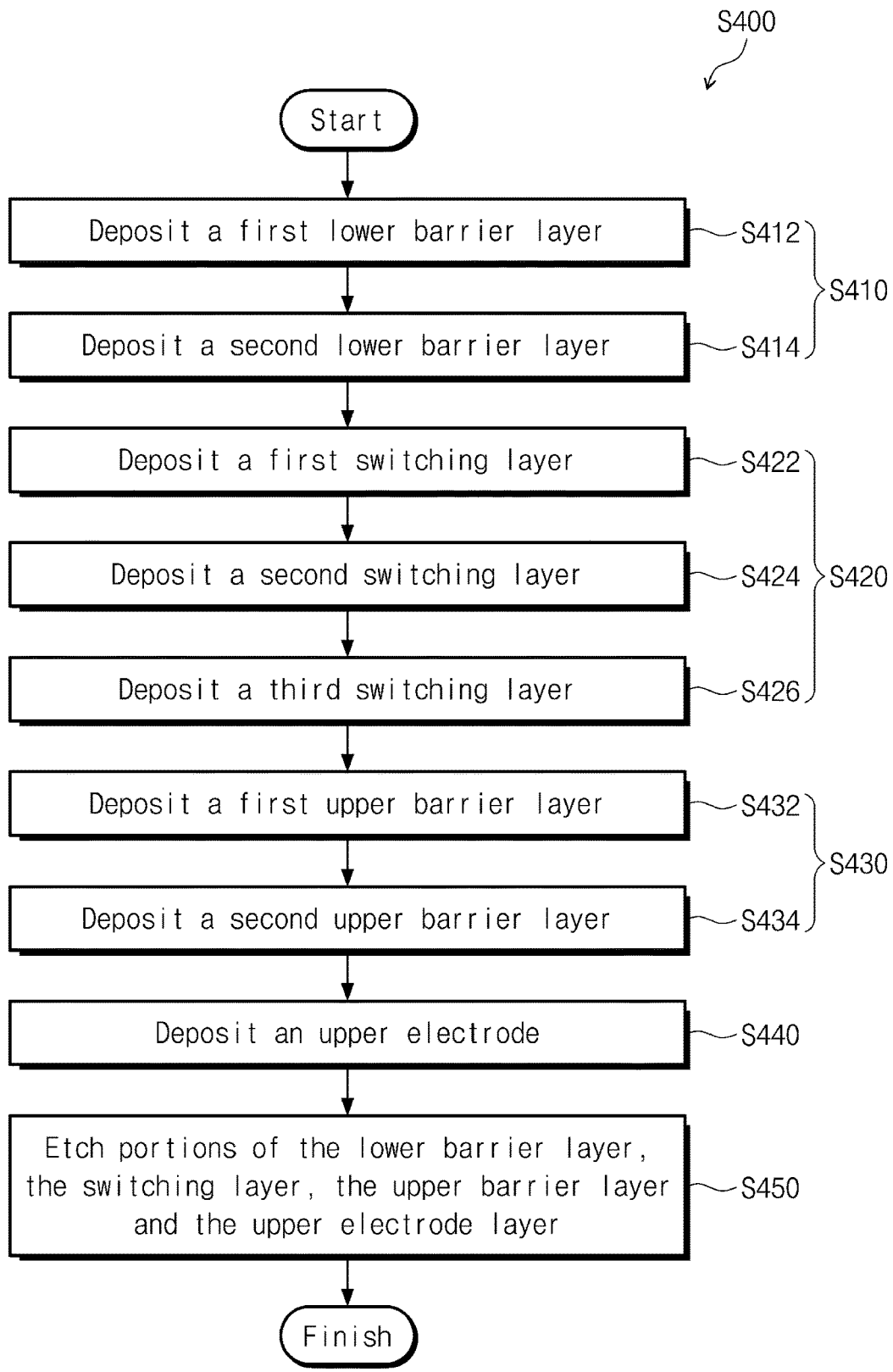
FIG. 19 is a flowchart illustrating an example embodiment of an operation of forming a switching element in FIG. 9.

FIG. 19 illustrates an embodiment of the operation S400 of forming the switching element SW in FIG. 9.

Referring to FIG. 19, the operation S400 of forming the switching element SW may include forming a lower barrier layer 131 (S410), forming a switching layer 141 (S420), forming an upper barrier layer 151 (S430), depositing an upper electrode layer 162 (S440), and etching portions of the lower barrier layer 131, the switching layer 141, the upper barrier layer 151 and the upper electrode layer 162 (S450).

Referring to FIGS. 16A-16B and 19, the lower barrier layer 131 may be formed using a sputtering method (S410). In some embodiments, the formation S410 of the lower barrier layer 131 may include depositing a first lower barrier layer 133 (S412) and depositing a second lower barrier layer 135 (S414).

The first lower barrier layer 133 may be deposited on the resultant structure of the substrate W (S412). The first lower barrier layer 133 may include low-density carbon.

The second lower barrier layer 135 may be deposited on the first lower barrier layer 133 (S414). A density of the second lower barrier layer 135 may be higher than a density of the first lower barrier layer 133. For example, the second lower barrier layer 135 may include high-density carbon.

Figure 20:
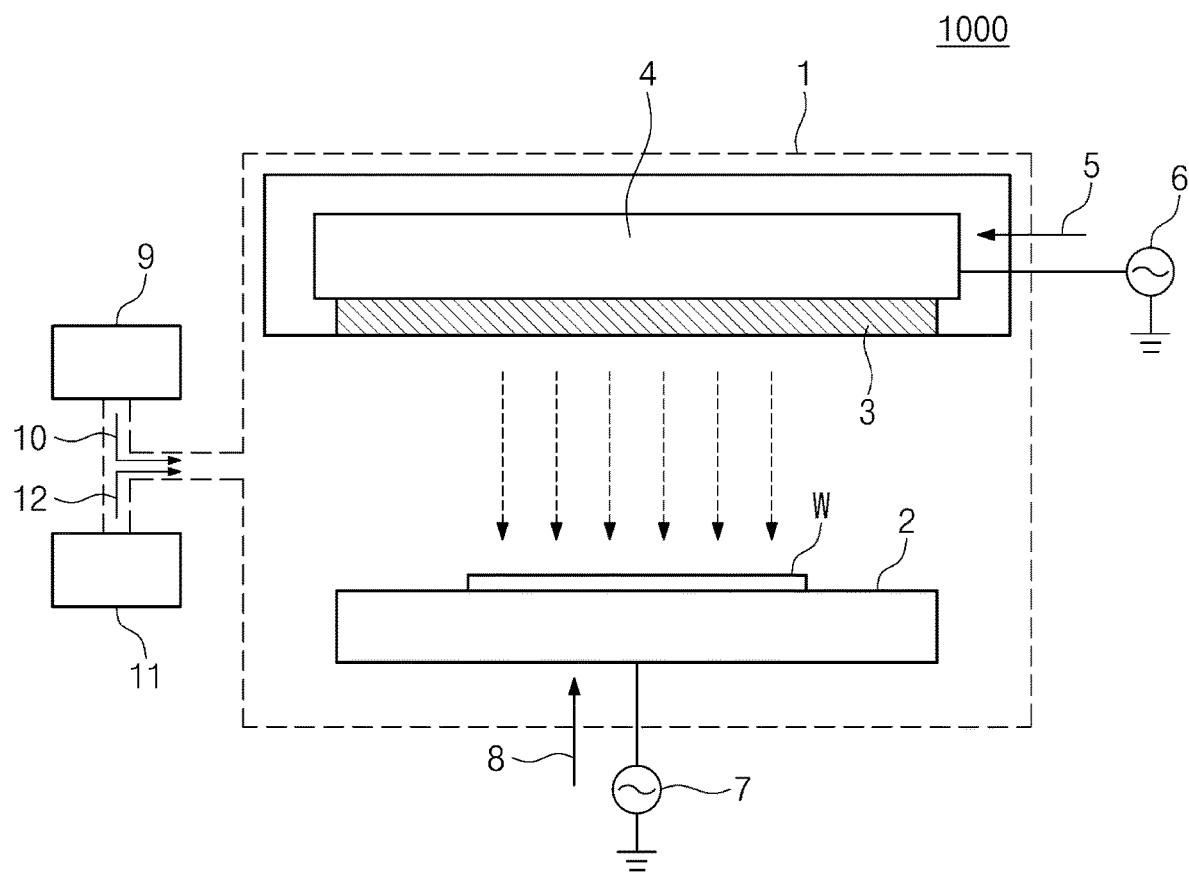
FIG. 20 is a schematic view illustrating a thin layer deposition apparatus for depositing a switching layer of FIG. 16, according to an example embodiment.

FIG. 20 illustrates a thin layer deposition apparatus 1000 for depositing the switching layer 141 of FIG. 16.

Referring to FIG. 20, the thin layer deposition apparatus 1000 may be a sputtering apparatus. For example, the thin layer deposition apparatus 1000 may include a chamber 1, a heater chuck 2, a target 3, a magnetron 4, first and second power supply units 6 and 7, and first and second gas supply units 9 and 11. The heater chuck 2 may be disposed in a lower portion of the chamber 1, and the magnetron 4 may be disposed in an upper portion of the chamber 1. The substrate W may be provided on the heater chuck 2. The target 3 may be fixed on a bottom surface of the magnetron 4. The target 3 may include a compound that includes at least one of Te and Se (i.e., chalcogenide elements) and at least one of Ge, Sb, Bi, Al, Pb, Sn, Ag, As, S, Si, In, Ti, Ga, and P. The first power supply unit 6 may provide first radio-frequency power 5 (e.g., source power) to the magnetron 4. The first radio-frequency power 5 may excite a process gas to induce plasma in the chamber 1. The first radio-frequency power 5 may accelerate the plasma toward the target 3 to generate target particles. The target particles may be deposited as a thin layer on the substrate W. The second power supply unit 7 may provide second radio-frequency power 8 (e.g., bias power) to the heater chuck 2. The second radio-frequency power 8 may accelerate the target particles and the plasma toward the substrate W to increase a density of the thin layer. The first and second gas supply units 9 and 11 may provide the first and second inert gases 10 and 12 into the chamber 1, respectively.

Referring to FIGS. 16A-16B, 19 and 20, the thin layer deposition apparatus 1000 may form the switching layer 141 by a sputtering method (S420). For example, the switching layer 141 may be formed of a compound that includes at least one of Te and Se (i.e., chalcogenide elements) and at least one of Ge, Sb, Bi, Al, Pb, Sn, Ag, As, S, Si, In, Ti, Ga, and P. The switching layer 141 may further include a thermal stabilization element in addition to the compound. The thermal stabilization element may include at least one of C, N, and O. For example, the switching layer 141 may include at least one of AsTe, AsSe, GeTe, SnTe, GeSe, SnTe, SnSe, ZnTe, AsTeSe, AsTeGe, AsSeGe, AsTeGeSe, AsSeGeSi, AsSeGeC, AsTeGeSi, AsTeGeS, AsTeGeSiIn, AsTeGeSiP, AsTeGeSiSbS, AsTeGeSiSbP, AsTeGeSeSb, AsTeGeSeSi, AsTeGeSiSeNS, SeTeGeSi, GeSbTeSe, GeBiTeSe, GeAsSbSe, GeAsBiTe, and GeAsBiSe. The heater chuck 2 may heat the substrate W to about 200 degrees Celsius or less. In some embodiments, the formation S420 of the switching layer 141 may include depositing a first switching layer 143 (S422), depositing a second switching layer 145 (S424), and depositing a third switching layer 147 (S426).

In detail, the first gas supply unit 9 may supply the first inert gas 10 into the chamber 1 to deposit the first switching layer 143 (S422). The first inert gas 10 may be formed into plasma by the first radio-frequency power 5, and the first inert gas 10 charged in the plasma may be accelerated to the target 3 by the first radio-frequency power 5 to generate target particles. The first inert gas 10 and the target particles may be provided onto the second lower barrier layer 135. Thus, the first switching layer 143 may contain the first inert gas 10. The first inert gas 10 may include argon.

Next, the second gas supply unit 11 may supply the second inert gas 12 into the chamber 1 to deposit the second switching layer 145 (S424). Thus, the second switching layer 145 may contain the second inert gas 12. A sticking coefficient of the second inert gas 12 may be less than a sticking coefficient of the first inert gas 10, and the number of voids generated by the second inert gas 12 may be less than the number of voids generated by the first inert gas 10. The second inert gas 12 may include krypton (Kr), xenon (Xe), and/or radon (Rn). When an atomic weight of the second inert gas 12 is greater than that of the first inert gas 10, a density of the second switching layer 145 may be higher than a density of the first switching layer 143. A surface roughness of the second switching layer 145 may be less than a surface roughness of the first switching layer 143. Alternatively, the second radio-frequency power 8 may increase the density of the second switching layer 145. When the first radio-frequency power 5 generates the plasma from the second inert gas 12, and then, generates target particles from the target 3, the second radio-frequency power 8 may accelerate the target particles and the second inert gas 12 to the substrate W. The accelerated second inert gas 12 may make the density of the second switching layer 145 greater than the density of the first switching layer 143.

Subsequently, the first gas supply unit 9 may supply the first inert gas 10 into the chamber 1 to deposit the third switching layer 147 (S426). The first inert gas 10 may be formed into plasma by the first radio-frequency power 5, and the first inert gas 10 charged in the plasma may be accelerated to the target 3 by the first radio-frequency power 5 to generate target particles. The target particles and the first inert gas 10 may be provided on the second switching layer 145. Thus, the third switching layer 147 may contain the first inert gas 10. A density of the third switching layer 147 may be less than the density of the second switching layer 145, and a surface roughness of the third switching layer 147 may be greater than the surface roughness of the second switching layer 145.

The upper barrier layer 151 may be formed on the third switching layer 147 by a sputtering method (S430). In some embodiments, the formation S430 of the upper barrier layer 151 may include depositing a first upper barrier layer 153 (S432) and depositing a second upper barrier layer 155 (S434).

The first upper barrier layer 153 may be deposited on the third switching layer 147 (S432). For example, the first upper barrier layer 153 may include high-density carbon. In an embodiment, the first upper barrier layer 153 may include high-density carbon doped with nitrogen (N).

The second upper barrier layer 155 may be deposited on the first upper barrier layer 153 (S434). For example, the second upper barrier layer 155 may include low-density carbon.

Next, the upper electrode layer 162 may be deposited by a sputtering method (S440). For example, the upper electrode layer 162 may include at least one of W, Ti, Al, Cu, C, CN, TiN, TiAlN, TiSiN, TiCN, WN, CoSiN, WSiN, TaN, TaCN, TaSiN, and TiO.

Referring to FIGS. 9 and 17A-17B, an etching apparatus (not shown) may etch the portions of the lower barrier layer 131, the switching layer 141, the upper barrier layer 151 and the upper electrode layer 162 to form the switching element SW (S450). For example, the portions of the lower barrier layer 131, the switching layer 141, the upper barrier layer 151 and the upper electrode layer 162 may be etched by a reactive ion etching (RIE) method. The switching element SW may include a lower barrier electrode 130, a switching pattern 140, an upper barrier electrode 150, and an upper electrode 160.

The lower barrier electrode 130 may include first and second lower barrier electrodes 132 and 134, and the first and second lower barrier electrodes 132 and 134 may be formed from the first and second lower barrier layers 133 and 135, respectively. The first lower barrier layer 133 may increase adhesive strength of the switching element SW with respect to the intermediate electrode ME and/or the first to third interlayer insulating layers 111, 113 and 115. In addition, the first lower barrier layer 133 may minimize or prevent a leaning phenomenon and/or a detachment phenomenon of the switching element SW during the etching process for forming the switching element SW.

The switching pattern 140 may include first, second and third switching patterns 142, 144 and 146, and the first to third switching patterns 142, 144 and 146 may be formed from the first to third switching layers 143, 145 and 147, respectively. The first switching layer 143 may increase adhesive strength between the second lower barrier layer 135 and the second switching layer 145. The third switching layer 147 may increase adhesive strength between the second switching layer 145 and the first upper barrier layer 153. The first and third switching layers 143 and 147 may minimize or prevent separation and/or detachment of the switching pattern 140 in the etching process.

The upper barrier electrode 150 may include first and second upper barrier electrodes 152 and 154, and the first and second upper barrier electrodes 152 and 154 may be formed from the first and second upper barrier layers 153 and 155, respectively. The second upper barrier electrode 154 may increase adhesive strength between the first upper barrier electrode 152 and the upper electrode 160 in the etching process of the first and second upper barrier layers 153 and 155. Thus, detachment of the upper electrode 160 may be minimized or prevented by the increased adhesive strength. The upper electrode 160 may be formed from the upper electrode layer 162 through the etching process.

Referring to FIGS. 18A-18B, a fourth interlayer insulating layer 117 may be formed between the switching elements SW. The fourth interlayer insulating layer 117 may be formed by a deposition process of a dielectric and a CMP process performed on the deposited dielectric.

Referring again to FIGS. 7A-7B and 9, the second conductive line CL2 may be formed on a portion of the fourth interlayer insulating layer 117 and the switching element SW (S500). The second conductive line CL2 may be formed by a deposition process of a metal layer, a photolithography process, and an etching process.

Thereafter, an upper insulating layer 119 may be formed between a plurality of the second conductive lines CL2. The upper insulating layer 119 may be formed by a deposition process of a dielectric and a CMP process performed on the deposited dielectric.

The switching element according to the embodiments may reduce the leakage current and improve the uniformity of the threshold voltage by using the first and second switching patterns which have different densities and are stacked.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A method of manufacturing a switching element, the method comprising:

forming a lower barrier layer on a substrate;
forming a switching layer on the lower barrier layer, using a sputtering method;
forming an upper barrier layer on the switching layer; and
removing portions of the lower barrier layer, the switching layer and the upper barrier layer to form the switching element,
wherein the forming of the switching layer comprises:
forming a first switching layer having a plurality of first voids formed by the sputtering method; and
forming a second switching layer on the first switching layer, the second switching layer having a plurality of second voids fewer than the plurality of first voids, and
wherein the second switching layer has a density different from a density of the first switching layer.

2. The method of claim 1, wherein the first switching layer comprises a first inert gas in the plurality of first voids, and
wherein the second switching layer comprises a second inert gas different from the first inert gas in the plurality of second voids.

3. The method of claim 2, wherein the first inert gas comprises an argon gas, and
wherein the second inert gas comprises any one or any combination of a krypton gas, a xenon gas, and a radon gas.

4. The method of claim 2, wherein the forming of the switching layer further comprises forming a third switching layer on the second switching layer by using the first inert gas.

5. A method of manufacturing a switching element, the method comprising:

forming a lower barrier layer on a substrate;
forming a switching layer on the lower barrier layer, using a sputtering method; and
forming an upper barrier layer on the switching layer,
wherein the forming of the switching layer comprises:
forming a first switching layer having a plurality of first voids formed by the sputtering method; and
forming a second switching layer on the first switching layer, the second switching layer having a plurality of second voids fewer than the plurality of first voids, and
wherein the second switching layer comprises a Kr gas in the plurality of second voids.

6. The method of claim 5, wherein the first switching layer comprises an Ar gas in the plurality of first voids.

7. The method of claim 6, wherein the first switching layer and the second switching layer are a lower density switching layer and a high density switching layer, respectively.

8. A method of manufacturing a switching element, the method comprising:

forming a lower barrier layer on a substrate;
forming a switching layer on the lower barrier layer, using a sputtering method; and
forming an upper barrier layer on the switching layer,
wherein the switching layer comprises a plurality of voids formed by the sputtering method and Kr gas in the plurality of voids.

9. The method of claim 8, wherein the switching layer further comprises Xe gas or Rn gas in the plurality of voids.

10. The method of claim 8, wherein the switching layer further comprises Ar gas in the plurality of voids.

* * * * *